US011891687B2

(12) United States Patent
Maniyara et al.

(10) Patent No.: US 11,891,687 B2
(45) Date of Patent: Feb. 6, 2024

(54) TRANSPARENT CONDUCTOR MATERIALS WITH ENHANCED NEAR INFRARED PROPERTIES AND METHODS OF FORMING THEREOF

(71) Applicants: Corning Incorporated, Corning, NY (US); ICFO—The Institute of Photonic Sciences, Barcelona (ES); INSTITUCIÓ CATALANA DE RECERCA I ESTUDIS AVANÇATS, Barcelona (ES)

(72) Inventors: Rinu Maniyara, Barcelona (ES); Prantik Mazumder, Ithaca, NY (US); Valerio Pruneri, Barcelona (ES)

(73) Assignees: CORNING INCORPORATED, Corning, NY (US); ICREA, Barcelona (ES); ICFO, Castellfedels (ES)

( * ) Notice: Subject to any disclaimer, the term of this patent is extended or adjusted under 35 U.S.C. 154(b) by 543 days.

(21) Appl. No.: 17/038,991

(22) Filed: Sep. 30, 2020

(65) Prior Publication Data
US 2021/0095371 A1  Apr. 1, 2021

Related U.S. Application Data

(60) Provisional application No. 62/908,079, filed on Sep. 30, 2019.

(51) Int. Cl.
| | |
|---|---|
| C23C 14/58 | (2006.01) |
| C23C 14/35 | (2006.01) |
| C23C 14/08 | (2006.01) |
| H01B 1/08 | (2006.01) |

(52) U.S. Cl.
CPC ........ C23C 14/5806 (2013.01); C23C 14/086 (2013.01); C23C 14/35 (2013.01); H01B 1/08 (2013.01)

(58) Field of Classification Search
CPC ... C23C 14/5806; C23C 14/086; C23C 14/35; H01B 1/08; H01L 31/022475; H01L 31/1884
USPC .............................. 427/58; 428/396; 429/336
See application file for complete search history.

(56) References Cited

U.S. PATENT DOCUMENTS

| | | | |
|---|---|---|---|
| 7,531,239 B2 | 5/2009 | Demiryont | |
| 8,043,954 B1 * | 10/2011 | Feldman-Peabody | ....................... C23C 14/0057 438/609 |
| 8,053,350 B2 * | 11/2011 | Feldman-Peabody | ....................... H01L 31/073 438/609 |
| 8,486,720 B2 * | 7/2013 | Banerjee | ............ G01N 33/5434 436/526 |
| 2012/0260983 A1 * | 10/2012 | Pruneri | .................. H05B 33/28 136/256 |
| 2017/0306470 A1 | 10/2017 | Stubbs | |

OTHER PUBLICATIONS

Shumei Song et al., Rapid thermal annealing of ITO films, Applied Surface Science, 257 (2011), 7061-7064. (Year: 2011).*
Alam, M. J. & Cameron, D. C. Optical and electrical properties of transparent conductive ITO thin films deposited by sol-gel process. Thin Solid Films 377-378, 455-459 (2000).
Askari, H. et al. Electrical and optical properties of ITO thin films prepared by DC magnetron sputtering for low-emitting coatings. arXiv:1409.5293.
Benoy et al., "Thickness dependence of the properties of indium tin oxide (ITO) FILMS prepared by activated reactive evaporation". Brazilian J. Phys. 39, (2009).
Chao et al., "Properties of Resistivity, Reflection and Absorption Related to Structure of ITO Films". J. Mater. Sci. Technol. 28, 325-328 (2012).
Ellmer, K. Past achievements and future challenges in the development of optically transparent electrodes. Nat. Photonics 6, 808-816 (2012).
Granqvist et al. "Transparent and conducting ITO films: New developments and applications". Thin Solid Films 411, 1-5 (2002).
Haacke, G., New figure of merit for transparent conductors, 47 J. Appl. Phys. 4086-89 (1976).
Inritsapong, Y. et al. Post-Annealing Effects On the Structural, Optical and Electrical Properties of ITO Films Studied By Spectroscopic Ellipsometry. Mod. Phys. Lett. B 24, 595-605 (2010).
Khusayfan et al., "Study of Structure and Electro-Optical Characteristics of Indium Tin Oxide Thin Films". Adv. Condens. Matter Phys. 2013, (2013).
Kim et al., "Tin doped indium oxide anodes with artificially controlled nano-scale roughness using segregated Ag nanoparticles for organic solar cells". Sci. Rep. 6, 33533 (2016).
Kim, D.-J. et al. Indium-free, highly transparent, flexible Cu2O/Cu/Cu2O mesh electrodes for flexible touch screen panels. Sci. Rep. 5, 16838 (2015).
Koseoglu, H. et al. Improvement of optical and electrical properties of ITO thin films by electro-annealing. Vacuum 120, 8-13 (2015).
Mullins, W. W. Theory of Thermal Grooving. J. Appl. Phys. 28, (1957).

(Continued)

*Primary Examiner* — Douglas J McGinty

(57) ABSTRACT

A method is provided for manufacturing an article comprising a transparent conductive material, wherein a transparent conductive material (e.g., indium tin oxide) is deposited onto a substrate (e.g., fused silica) by physical vapor deposition, then annealed at high temperature (i.e., at least 450° C.) in a nitrogen atmosphere. The resulting article comprises a transparent conductive material that reduces the trade-off between low resistivity (or sheet resistance) and high near infrared transmission. For example, the transparent conductive material thus obtained may possess a transmission of at least 80% at 1550 nm while having a resistivity of less than or equal to about $5 \times 10^{-4}$ Ohm-cm and a Haacke figure of merit of at least about $40 \times 10^{-4} \Omega^{-1}$. Also provided is a method for modulating the resistivity and/or the near infrared transmission of a transparent conductive material by annealing the transparent conductive material at a high temperature under nitrogen atmosphere.

20 Claims, 17 Drawing Sheets

(56) References Cited

OTHER PUBLICATIONS

Pokaipisi et al., "Influence of Annealing Temperature on the Properties of ITO Films Prepared by Electron Beam Evaporation and Ion-Assisted Deposition". Nat. Sci. 42, 362-366 (2008).

Raoufi et al,. "Surface characterization and microstructure of ITO thin films at different annealing temperatures". Appl. Surf. Sci. 253, 9085-9090 (2007).

Sathiaraj, T. S. Effect of annealing on the structural, optical and electrical properties of ITO films by RF sputtering under low vacuum level. Microelectronics J. 39, 1444-1451 (2008).

Sekitani, T. et al. "Stretchable active-matrix organic light-emitting diode display using printable elastic conductors". Nat. Mater. vol. 8, , 2009, 494-499.

Song, S. et al., "Rapid thermal annealing of ITO films", Appl. Surf. Sci. 257, 2011, pp. 7061-7064.

Wang et al., "Near-infrared transparent electrodes for precision Teng-Man electro-optic measurements: $In_2O_3$ thin-film electrodes with tunable near-infrared transparency". Appl. Phys. Lett. 87, 2005, pp. 161107-1-161107-3.

Zhang et al., "Low resistance indium tin oxide contact to n-GaAs nanowires", Semicond. Sci. Technol. 29 (2014) 054002 (5pp), pp. 1-6.

Zhao et al., "Stable ultrathin partially oxidized copper film electrode for highly efficient flexible solar cells", Nature Communications, 6:8830, 2015, pp. 1-8.

* cited by examiner

TRANSPARENT CONDUCTOR MATERIALS WITH ENHANCED NEAR INFRARED PROPERTIES AND METHODS OF FORMING THEREOF

This application claims the benefit of priority under 35 U.S.C. § 119 of U.S. Provisional Application Ser. No. 62/908,079, filed on Sep. 30, 2019, the content of which is relied upon and incorporated herein by reference in its entirety.

FIELD

The present invention relates generally to the field of transparent conductive materials with high transmission in the near infrared ("NIR") region and low resistivity and/or sheet resistance, and methods for forming the same.

BACKGROUND

Transparent conductors (TCs) are capable of conducting electricity while being optically transparent, and thus are essential elements in many optoelectronic and photonic devices such as solar cells, touch screens, liquid crystal displays (LCDs) and light emitting diodes (LEDs). In many applications, high optical transmission beyond the visible spectrum into the infrared (IR) wavelengths is crucial. Examples include high-efficiency solar cells (which convert IR and visible light into electricity), IR photodetectors and imaging cameras, IR light sources, and optical communications operating in the low loss window of optical fibers. Materials such as graphene, carbon nanotubes, ultra-thin metal films, metallic nanowires, conductive polymers, and wide band gap semiconductors have been widely studied as transparent conductors, but they typically have been investigated and optimized in the visible wavelength range (380-750 nm).

Despite the development of many alternative transparent conductors, indium tin oxide (ITO) is still considered a prototypical material due to its high transmission, electrical conductivity, excellent adhesion, etching properties, and stability in harsh environments. Considerable effort has been directed toward increasing the transparency and conductivity of ITO films with various doping mechanisms, thermal/chemical treatments and deposition methods. However, most of the work so far has focused on transparency in the visible spectrum. ITO transparent conductors for the near IR wavelength range (750-2400 nm) exhibit poor transmission performance, when compared to the visible range. And when high transmission has been achieved, it has been at the expense of the electrical conductivity.

Therefore, there exists a need for transparent conductor materials having high transmission in the near IR range and having low resistivity (i.e., high conductivity), and for methods of forming the same.

SUMMARY

In some embodiments, a method for producing an article comprises (a) depositing a layer of a transparent conductive material on a substrate, wherein the layer of the transparent conductive material has a thickness between about 20 nm and 250 nm; and (b) annealing the transparent conductive material at a temperature of at least about 450° C. for at least about 2 min; wherein after the annealing, the layer of the transparent conductive material has a transmission of at least about 70% at 1550 nm or a Haacke figure of merit of at least about $40 \times 10^{-4} \Omega^{-1}$.

In one aspect, which is combinable with any of the other aspects or embodiments, the annealing takes place at a temperature of about 750° C.

In one aspect, which is combinable with any of the other aspects or embodiments, the transparent conductive material comprises indium tin oxide.

In one aspect, which is combinable with any of the other aspects or embodiments, the thickness of the layer of the transparent conductive material is between about 50 nm and about 150 nm.

In one aspect, which is combinable with any of the other aspects or embodiments, the layer of the transparent conductive material has a resistivity of less than or equal to about $5 \times 10^{-4}$ Ohm-cm after the annealing.

In one aspect, which is combinable with any of the other aspects or embodiments, the depositing comprises physical vapor deposition. In another aspect, which is combinable with any of the other aspects or embodiments, the depositing comprises magnetron sputtering.

In one aspect, which is combinable with any of the other aspects or embodiments, the annealing takes place in an atmosphere containing less than about 5% oxygen.

In one aspect, which is combinable with any of the other aspects or embodiments, the layer of the transparent conductive material has a transmission in the visible range of at least 80% after the annealing.

In some embodiments, a method for modulating the resistivity and optical transmission of a transparent conductive material comprises annealing the transparent conductive material at a temperature of at least 450° C. for at least about 2 minutes, wherein after the annealing, the transparent conductive material has a transmission of at least about 70% at 1550 nm or a Haacke figure of merit of at least about $40 \times 10^{-4} \Omega^{-1}$.

In one aspect, which is combinable with any of the other aspects or embodiments, the transparent conductive material comprises indium tin oxide.

In one aspect, which is combinable with any of the other aspects or embodiments, the transparent conductive material comprises a layer with a thickness of between about 20 nm and about 250 nm.

In one aspect, which is combinable with any of the other aspects or embodiments, after the annealing, the transparent conductive material has a transmission of at least about 80% at 1550 nm or a Haacke figure of merit of at least about $60 \times 10^{-4} \Omega^{-1}$. In another aspect, which is combinable with any of the other aspects or embodiments, after the annealing, the transparent conductive material has a transmission of at least about 70% at 1550 nm and a resistivity of less than or equal to about $5 \times 10^{-4}$ Ohm-cm.

In one aspect, which is combinable with any of the other aspects or embodiments, the annealing takes place in an atmosphere containing less than about 5% oxygen.

In some embodiments, an article comprises a layer of a transparent conductive material, wherein the layer of the transparent conductive material has a thickness of between about 20 nm and about 250 nm, a transmission of at least 70% at 1550 nm or a Haacke figure of merit of at least $40 \times 10^{-4} \Omega^{-1}$.

In one aspect, which is combinable with any of the other aspects or embodiments, the transparent conductive material comprises indium tin oxide.

In one aspect, which is combinable with any of the other aspects or embodiments, the thickness of the layer of the transparent conductive material is between about 50 nm and about 150 nm.

In one aspect, which is combinable with any of the other aspects or embodiments, the layer of the transparent conductive material has a resistivity of less than or equal to about $5\times10^{-4}$ Ohm-cm. In another aspect, which is combinable with any of the other aspects or embodiments the layer of the transparent conductive material has a transmission of at least about 80% at 1550 nm and a Haacke figure of merit of at least about $60\times10^{-4}\Omega^{-1}$.

In one aspect, which is combinable with any of the other aspects or embodiments, the layer of the transparent conductive material has a transmission in the visible range of at least 80%.

DETAILED DESCRIPTION

Figure 1:
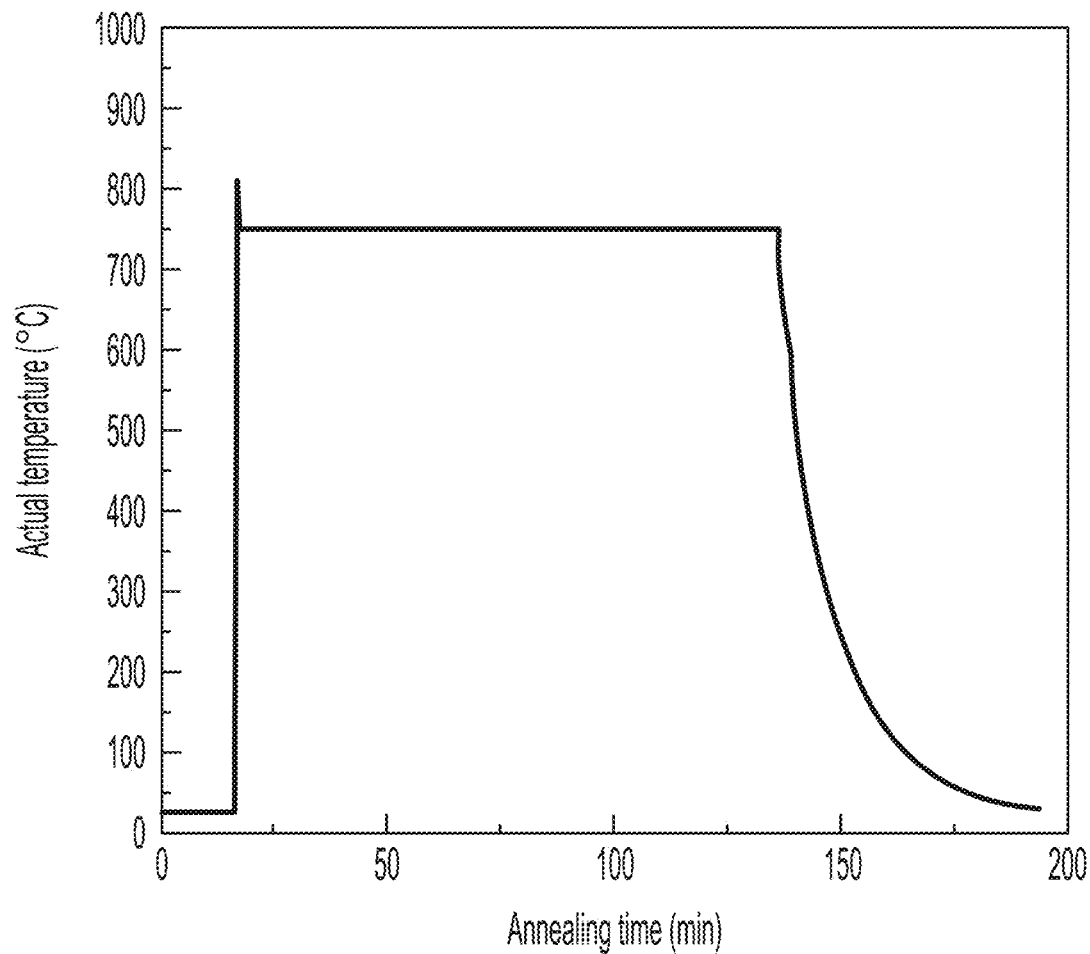
FIG. 1 shows a typical high-temperature annealing (HTA) process flow diagram.

In some embodiments, the present disclosure relates to a method for producing an article comprising a layer of a transparent conductive material, the method comprising (a) depositing a layer comprising a transparent conductive material, and (b) annealing the transparent conductive material at a temperature of at least about 450° C.

In some embodiments, the transparent conductive material according to the present disclosure is indium tin oxide (ITO), zinc oxide (ZnO), antimony-doped zinc oxide (AZO) antimony-doped tin oxide (ATO), fluorine-doped tin oxide (FTO), gallium-doped zinc oxide (GZO), molybdenum-doped indium oxide (IMO), magnesium-doped zinc oxide (MZO), or other like materials, or combinations or mixtures thereof. In some embodiments, the transparent conductive material is ITO.

In some embodiments, the transparent conductive material may be formed on or deposited onto a substrate. The substrate of the present disclosure may be planar (e.g., a silicon wafer or fused silica substrate), or it may be of any other shape or dimension appropriate for forming an article. In some embodiments, the substrate may comprise microparticles or nanoparticles, which may take the form or shape of spheres, prisms, wires, rods cubes, or any other shape. Substrates according the present disclosure may include ceramics, glasses, metals, or semiconductors. In an embodiment, the substrate according to the present disclosure is fused silica.

In some embodiments, the thickness of the layer of the transparent conductive material may be selected to facilitate achieving either low resistivity (or low sheet resistance), high NIR transmission, or both. In some embodiments, the transparent conductive material has a thickness between about 10 nm and about 1000 nm, between about 15 nm and about 500 nm, between about 20 nm and about 250 nm, between about 50 nm and about 150 nm, or between about 75 nm and about 125 nm, or any range or value thereinbetween. In some embodiments, the transparent conductive material has a thickness of about 10 nm, about 15 nm, about 20 nm, about 30 nm, about 40 nm, about 50 nm, about 60 nm, about 70 nm, about 80 nm, about 90 nm, about 100 nm, about 110 nm, about 120 nm, about 130 nm, about 140 nm, about 150 nm, about 160 nm, about 170 nm, about 180 nm, about 190 nm, about 200 nm, about 250 nm, about 300 nm, about 350 nm, about 400 nm, about 450 nm, about 500 nm, about 550 nm, about 600 nm, about 650 nm, about 700 nm, about 750 nm, about 800 nm, about 850 nm, about 900 nm, about 950 nm, or about 1000 nm, or any value thereinbetween.

In some embodiments, the depositing comprises physical vapor deposition. In some embodiments, the physical vapor deposition comprises magnetron sputtering, pulsed laser deposition, cathodic arc deposition, evaporative deposition, closed-space sublimation, pulsed electron deposition, or electron beam physical vapor deposition, other equivalent methods, or any combination thereof. In an embodiment, the physical vapor deposition comprises sputter deposition (e.g., magnetron sputtering deposition).

In some embodiments of the method, the annealing is a high-temperature annealing (HTA). In some embodiments, the annealing takes place at a temperature of at least about 450° C., at least about 500° C., at least about 550° C., at least about 600° C., at least about 650° C., at least about 700° C., at least about 750° C., at least about 800° C., at least about 850° C., or at least about 900° C., any combination thereof, or any range or value therein. In some embodiments, the annealing takes place between about 400° C. and about 900° C., between about 450° C. and about 850° C., between about 500° C. and about 800° C., or between about 550° C. and about 750° C., or any range or value therein. In some embodiments, the annealing takes place at about 450° C., about 475° C., about 500° C., about 525° C., about 550° C., about 575° C., about 600° C., about 625° C., about 650° C., about 675° C., about 700° C., about 725° C., about 750° C., about 775° C., about 800° C., about 825° C., about 850° C., about 875° C., about 900° C., any combination thereof, or any value thereinbetween.

In some embodiments, the annealing takes place for at least about 1 min, at least about 2 min, at least about 3 min, at least about 4 min, at least about 5 min, at least about 10 min, at least about 15 min, at least about 20 min, at least about 30 min, at least about 45 min, at least about 1 hr, at least about 1.5 hr, at least about 2 hr, at least about 2.5 hr, at least about 3 hr, at least about 3.5 hr, at least about 4 hr, at least about 4.5 hr, at least about 5 hr, at least about 5.5 hr, at least about 6 hr, at least about 6.5 hr, at least about 7 hr, at least about 7.5 hr, at least about 8 hr, at least about 8.5 hr, at least about 9 hr, at least about 9.5 hr, at least about 10 hr, at least about 10.5 hr, at least about 11 hr, at least about 12 hr, at least about 13 hr, at least about 14 hr, at least about 15 hr, or at least about 16 hr, or longer, or any range therein.

In some embodiments, the annealing takes place for about 1 min, about 2 min, about 3 min, about 4 min, about 5 min, about 10 min, about 15 min, about 20 min, about 30 min, about 45 min, about 1 hr, about 1.5 hr, about 2 hr, about 2.5 hr, about 3 hr, about 3.5 hr, about 4 hr, about 4.5 hr, about 5 hr, about 5.5 hr, about 6 hr, about 6.5 hr, about 7 hr, about 7.5 hr, about 8 hr, about 8.5 hr, about 9 hr, about 9.5 hr, about 10 hr, about 10.5 hr, about 11 hr, about 12 hr, about 13 hr, about 14 hr, about 15 hr, or about 16 hr, or any value thereinbetween.

In some embodiments, the annealing takes place in an atmosphere that is substantially free of oxygen, such as $N_2$, Ar, $N_2/H_2$, $Ar/H_2$, or under vacuum. In some embodiments, the annealing takes place in an atmosphere that contains less than about 10% oxygen, less than about 9% oxygen, less than about 8% oxygen, less than about 7% oxygen, less than about 6% oxygen, less than about 5% oxygen, less than about 4% oxygen, less than about 3% oxygen, less than about 2% oxygen, less than about 1% oxygen, less than about 0.8% oxygen, less than about 0.6% oxygen, less than about 0.4% oxygen, less than about 0.2% oxygen, less than about 0.1% oxygen, less than about 0.05% oxygen, less than about 0.01% oxygen, less than about 0.005% oxygen, less than about 0.001% oxygen, less than about 0.0005% oxygen, or less than about 0.0001% oxygen.

In some embodiments, after the annealing, the transparent conductive material has a transmission at 1550 nm of at least about 80%, at least about 75%, at least about 70%, at least about 65%, or at least about 60% at 1550 nm, and/or a resistivity of no greater than about $5 \times 10^{-4}$ Ohm-cm, no greater than about $4.5 \times 10^{-4}$ Ohm-cm, no greater than about $4 \times 10^{-4}$ Ohm-cm, no greater than about $3.5 \times 10^{-4}$ Ohm-cm, no greater than about $3 \times 10^{-4}$ Ohm-cm, no greater than about $2.5 \times 10^{-4}$ Ohm-cm, no greater than about $2 \times 10^{-4}$ Ohm-cm, no greater than about $1.5 \times 10^{-4}$ Ohm-cm, or no greater than about $1 \times 10^{-4}$ Ohm-cm, or any range therein.

In some embodiments, after the annealing, the transparent conductive material has a transmission at 1550 nm of about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, or about 85%, or any value thereinbetween, and/or a resistivity of about $1 \times 10^{-4}$ Ohm-cm, about $1.2 \times 10^{-4}$ Ohm-cm, about $1.4 \times 10^{-4}$ Ohm-cm, about $1.6 \times 10^{-4}$ Ohm-cm, about $1.8 \times 10^{-4}$ Ohm-cm, about $2.0 \times 10^{-4}$ Ohm-cm, about $2.2 \times 10^{-4}$ Ohm-cm, about $2.4 \times 10^{-4}$ Ohm-cm, about $2.6 \times 10^{-4}$ Ohm-cm, about $2.8 \times 10^{-4}$ Ohm-cm, about $3.0 \times 10^{-4}$ Ohm-cm, about $3.5 \times 10^{-4}$ Ohm-cm, about $4.0 \times 10^{-4}$ Ohm-cm, about $4.5 \times 10^{-4}$ Ohm-cm, or about $5.0 \times 10^{-4}$ Ohm-cm, or any value thereinbetween.

In some embodiments, after the annealing, the transparent conductive material according to the present disclosure has a transmission at 1550 nm of about 63.9% to about 82.4% and a resistivity of about $1.2 \times 10^{-4}$ Ohm-cm to about $2.2 \times 10^{-4}$ Ohm-cm. In an embodiment, after the annealing, the transparent conductive material according to the present disclosure has a transmission at 1550 nm of about 63.9% and a resistivity of about $1.2 \times 10^{-4}$ Ohm-cm. In an embodiment, after the annealing, the transparent conductive material according to the present disclosure has a transmission at 1550 nm of about 82.4% and a resistivity of about $2.2 \times 10^{-4}$ Ohm-cm.

In some embodiments of the method, after the annealing, the transparent conductive material according to the present disclosure exhibits and improved trade-off between sheet resistance and near infrared (NIR) transmission (750-2400 nm). In some embodiments, after the annealing, the transparent conductive material has a transmission of at least about 80%, at least about 75%, at least about 70%, at least about 65%, or at least about 60% at 1550 nm, and/or a sheet resistance of no greater than about 50 Ohm/sq., no greater than about 45 Ohm/sq., no greater than about 40 Ohm/sq., no greater than about 35 Ohm/sq., no greater than about 30 Ohm/sq., no greater than about 25 Ohm/sq., no greater than about 20 Ohm/sq., no greater than about 15 Ohm/sq., or no greater than about 10 Ohm/sq., or any range therein.

In some embodiments of the method, after the annealing, the transparent conductive material has a transmission at 1550 nm of about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, or about 85%, or any value thereinbetween, and/or a sheet resistance of about 10 Ohm/sq., about 12 Ohm/sq., about 14 Ohm/sq., about 16 Ohm/sq., about 18 Ohm/sq., about 20 Ohm/sq., about 22 Ohm/sq., about 24 Ohm/sq., about 26 Ohm/sq., about 28 Ohm/sq., about 30 Ohm/sq., about 35 Ohm/sq., about 40 Ohm/sq., about 45 Ohm/sq., or about 50 Ohm/sq., or any value thereinbetween.

In some embodiments of the method, the transparent conductive material according to the present disclosure has a transmission at 1550 nm of about 63.9% to about 82.4% and a sheet resistance of about 12.2 Ohm/sq. to about 22 Ohm/sq., after the annealing. In an embodiment, after the annealing, the transparent conductive material according to the present disclosure has a transmission at 1550 nm of about 63.9% and a sheet resistance of about 12.2 Ohm/sq. In an embodiment, after the annealing, the transparent conductive material according to the present disclosure has a transmission at 1550 nm of about 82.4% and a sheet resistance of about 22 Ohm/sq.

In some embodiments of the method, after the annealing, the transparent conductive material also maintains a high transmission over the visible wavelength range (380-750 nm). In some embodiments, the transparent conductive material has a transmission in the visible range of at least 75%, at least 76%, at least 77%, at least 78%, at least 79%, at least 80%, at least 81%, at least 82%, at least 83%, at least 84%, or at least 85%, or any range or value thereinbetween. In an embodiment, the transparent conductive material has a transmission in the visible range of about 83.9%.

In some embodiments, the trade-off between resistivity and transmission in the NIR region may be characterized by the Haacke figure of merit (FoM). The Haacke FoM is given by the following equation:

$$FoM\ (\Omega^{-1}) = \frac{T^{10}}{R_s} \qquad \text{(Equation 1)}$$

where T is the optical transmission (%) and $R_s$ is the sheet resistance. (See Haacke, G., *New figure of merit for transparent conductors*, 47 J. APPL. PHYS. 4086-89 (1976).)

In some embodiments of the method, after the annealing, the transparent conductive material according to the present disclosure has a transmission at 1550 nm of about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, or about 85%, or any value thereinbetween, and/or a Haacke FoM of at least about $5\times10^{-4}\Omega^{-1}$, at least about $10\times10^{-4}\Omega^{-1}$, at least about $15\times10^{-4}\Omega^{-1}$, at least about $20\times10^{-4}\Omega^{-1}$, at least about $25\times10^{-4}\Omega^{-1}$, at least about $30\times10^{-4}\Omega^{-1}$, at least about $35\times10^{-4}\Omega^{-1}$, at least about $40\times10^{-4}\Omega^{-2}$, at least about $45\times10^{-4}\Omega^{-1}$, at least about $50\times10^{-4}\Omega^{-1}$, at least about $55\times10^{-4}\Omega^{-1}$, at least about $60\times10^{-4}\Omega^{-1}$, at least about $65\times10^{-4}\Omega^{-1}$, at least about $70\times10^{-4}\Omega^{-1}$, at least about $75\times10^{-4}\Omega^{-2}$, or at least about $80\times10^{-4}\Omega^{-1}$, or any range therein.

In some embodiments of the method, after the annealing, the transparent conductive material according to the present disclosure has a transmission at 1550 nm of about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, or about 85%, or any value thereinbetween, and/or a Haacke FoM of about $5\times10^{-4}\Omega^{-1}$, about $10\times10^{-4}\Omega^{-1}$, about $15\times10^{-4}\Omega^{-1}$, about $20\times10^{-4}\Omega^{-1}$, about $25\times10^{-4}\Omega^{-1}$, about $30\times10^{-4}\Omega^{-1}$, about $35\times10^{-4}\Omega^{-1}$, about $40\times10^{-4}\Omega^{-1}$, about $45\times10^{-4}\Omega^{-1}$, about $50\times10^{-4}\Omega^{-1}$, about $55\times10^{-4}\Omega^{-1}$, about $60\times10^{-4}\Omega^{-1}$, about $65\times10^{-4}\Omega^{-1}$, about $70\times10^{-4}\Omega^{-1}$, about $75\times10^{-4}\Omega^{-1}$, or about $80\times10^{-4}\Omega^{-1}$, or any value thereinbetween.

In an embodiment, after the annealing, the transparent conductive material according to the present disclosure has a transmission at 1550 nm of about 82.4% and a Haacke FoM of about $64.2\times10^{-4}\Omega^{-1}$. In another embodiment, after the annealing, the transparent conductive material according to the present disclosure has a transmission at 1550 nm of about 63.9% and a Haacke FoM of about $9.3\times10^{-4}\Omega^{-1}$.

In some embodiments, the method for producing an article comprising a transparent conductive material further comprises (c) depositing an additional material on the transparent conductive material, either after the annealing (b), or between the depositing (a) and the annealing (b). In some embodiments, an additional material according to the present disclosure may comprise a self-assembled monolayer, a polymer layer, a metal layer, a ceramic layer, a semiconductor layer, or a glass layer.

In other embodiments, the present disclosure provides a method for modulating the resistivity and/or near IR transmission of a transparent conductive material. In some embodiments, the method comprises annealing the transparent conductive material at a temperature of at least 450° C. for at least 2 min.

In some embodiments of the method for modulating resistivity and/or NIR transmission of a transparent conductive material, the annealing is a high-temperature annealing (HTA). In some embodiments the annealing takes place at a temperature of at least about 450° C., at least about 500° C., at least about 550° C., at least about 600° C., at least about 650° C., at least about 700° C., at least about 750° C., at least about 800° C., at least about 850° C., or at least about 900° C., any combination thereof, or any range or value therein. In some embodiments, the annealing takes place at between about 400° C. and about 900° C., between about 450° C. and about 850° C., between about 500° C. and about 800° C., or between about 550° C. and about 750° C., or any range or value therein. In some embodiments, the annealing takes place at about 450° C., about 475° C., about 500° C., about 525° C., about 550° C., about 575° C., about 600° C., about 625° C., about 650° C., about 675° C., about 700° C., about 725° C., about 750° C., about 775° C., about 800° C., about 825° C., about 850° C., about 875° C., about 900° C., any combination thereof, or any value thereinbetween.

In some embodiments of the method for modulating resistivity and/or NIR transmission of a transparent conductive material, the annealing takes place for at least about 1 min, at least about 2 min, at least about 3 min, at least about 4 min, at least about 5 min, at least about 10 min, at least about 15 min, at least about 20 min, at least about 30 min, at least about 45 min, at least about 50 min, at least about 1 hr, at least about 1.5 hr, at least about 2 hr, at least about 2.5 hr, at least about 3 hr, at least about 3.5 hr, at least about 4 hr, at least about 4.5 hr, at least about 5 hr, at least about 5.5 hr, at least about 6 hr, at least about 6.5 hr, at least about 7 hr, at least about 7.5 hr, at least about 8 hr, at least about 8.5 hr, at least about 9 hr, at least about 9.5 hr, at least about 10 hr, at least about 10.5 hr, at least about 11 hr, at least about 12 hr, at least about 13 hr, at least about 14 hr, at least about 15 hr, or at least about 16 hr, or longer, or any range therein.

In some embodiments of the method for modulating resistivity and/or NIR transmission of a transparent conductive material, the annealing takes place for about 1 min, about 2 min, about 3 min, about 4 min, about 5 min, about 10 min, about 15 min, about 20 min, about 30 min, about 45 min, about 1 hr, about 1.5 hr, about 2 hr, about 2.5 hr, about 3 hr, about 3.5 hr, about 4 hr, about 4.5 hr, about 5 hr, about 5.5 hr, about 6 hr, about 6.5 hr, about 7 hr, about 7.5 hr, about 8 hr, about 8.5 hr, about 9 hr, about 9.5 hr, about 10 hr, about 10.5 hr, about 11 hr, about 12 hr, about 13 hr, about 14 hr, about 15 hr, or about 16 hr, or any value thereinbetween.

In some embodiments, the annealing takes place in an atmosphere that is substantially free of oxygen, such as N, Ar, N/H$_2$, Ar/H$_2$, or under vacuum. In some embodiments, the annealing takes place in an atmosphere that contains less than about 10% oxygen, less than about 9% oxygen, less than about 8% oxygen, less than about 7% oxygen, less than about 6% oxygen, less than about 5% oxygen, less than about 4% oxygen, less than about 3% oxygen, less than about 2% oxygen, less than about 1% oxygen, less than about 0.8% oxygen, less than about 0.6% oxygen, less than about 0.4% oxygen, less than about 0.2% oxygen, less than about 0.1% oxygen, less than about 0.05% oxygen, less than about 0.01% oxygen, less than about 0.005% oxygen, less than about 0.001% oxygen, less than about 0.0005% oxygen, or less than about 0.0001% oxygen.

In some embodiments of the method for modulating resistivity and/or NIR transmission of a transparent conductive material, after the annealing, the transparent conductive material has a transmission at 1550 nm of at least 80%, at least about 75%, at least about 70%, at least about 65%, or at least about 60% at 1550 nm, and/or a resistivity of no greater than about 5×10$^{-4}$ Ohm-cm, no greater than about 4.5×10$^{-4}$ Ohm-cm, no greater than about 4×10$^{-4}$ Ohm-cm, no greater than about 3.5×10$^{-4}$ Ohm-cm, no greater than about 3×10$^{-4}$ Ohm-cm, no greater than about 2.5×10$^{-4}$ Ohm-cm, no greater than about 2×10$^{-4}$ Ohm-cm, no greater than about 1.5×10$^{-4}$ Ohm-cm, or no greater than about 1×10$^{-4}$ Ohm-cm, or any range therein.

In some embodiments of the method for modulating resistivity and/or NIR transmission of a transparent conductive material, after the annealing, the transparent conductive material has a transmission at 1550 nm of about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, or about 85%, or any value thereinbetween, and/or a resistivity of about 1×10$^{-4}$ Ohm-cm, about 1.2×10$^{-4}$ Ohm-cm, about 1.4×10$^{-4}$ Ohm-cm, about 1.6×10$^{-4}$ Ohm-cm, about 1.8×10$^{-4}$ Ohm-cm, about 2.0×10$^{-4}$ Ohm-cm, about 2.2×10$^{-4}$ Ohm-cm, about 2.4×10$^{-4}$ Ohm-cm, about 2.6×10$^{-4}$ Ohm-cm, about 2.8×10$^{-4}$ Ohm-cm, about 3.0×10$^{-4}$ Ohm-cm, about 3.5×10$^{-4}$ Ohm-cm, about 4.0×10$^{-4}$ Ohm-cm, about 4.5×10$^{-4}$ Ohm-cm, or about 5.0×10$^{-4}$ Ohm-cm, or any value thereinbetween.

In some embodiments of the method for modulating resistivity and/or NIR transmission of a transparent conductive material, after the annealing, the transparent conductive material according to the present disclosure has a transmission at 1550 nm of about 63.9% to about 82.4% and a resistivity of about 1.2×10$^{-4}$ Ohm-cm to about 2.2×10$^{-4}$ Ohm-cm. In an embodiment, after the annealing, the transparent conductive material according to the present disclosure has a transmission at 1550 nm of about 63.9% and a resistivity of about 1.2×10$^{-4}$ Ohm-cm. In an embodiment, after the annealing, the transparent conductive material according to the present disclosure has a transmission at 1550 nm of about 82.4% and a resistivity of about 2.2×10$^{-4}$ Ohm-cm.

In some embodiments of the method for modulating resistivity and/or NIR transmission of a transparent conductive material, the transparent conductive material according to the present disclosure exhibits and improved trade-off between sheet resistance and near infrared (NIR) transmission (750-2400 nm). In some embodiments, after the annealing, the transparent conductive material has a transmission of at least about 80%, at least about 75%, at least about 70%, at least about 65%, or at least about 60% at 1550 nm, and/or a sheet resistance of no greater than about 50 Ohm/sq., no greater than about 45 Ohm/sq., no greater than about 40 Ohm/sq., no greater than about 35 Ohm/sq., no greater than about 30 Ohm/sq., no greater than about 25 Ohm/sq., no greater than about 20 Ohm/sq., no greater than about 15 Ohm/sq., or no greater than about 10 Ohm/sq., or any range therein.

In some embodiments of the method for modulating resistivity and/or NIR transmission of a transparent conductive material, after the annealing, the transparent conductive material has a transmission at 1550 nm of about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, or about 85%, or any value thereinbetween, and/or a sheet resistance of about 10 Ohm/sq., about 12 Ohm/sq., about 14 Ohm/sq., about 16 Ohm/sq., about 18 Ohm/sq., about 20 Ohm/sq., about 22 Ohm/sq., about 24 Ohm/sq., about 26 Ohm/sq., about 28 Ohm/sq., about 30 Ohm/sq., about 35 Ohm/sq., about 40 Ohm/sq., about 45 Ohm/sq., or about 50 Ohm/sq., or any value thereinbetween.

In some embodiments of the method for modulating resistivity and/or NIR transmission of a transparent conductive material, the transparent conductive material according to the present disclosure has a transmission at 1550 nm of about 63.9% to about 82.4% and a sheet resistance of about 12.2 Ohm/sq. to about 22 Ohm/sq., after the annealing. In an embodiment, after the annealing, the transparent conductive material according to the present disclosure has a transmission at 1550 nm of about 63.9% and a sheet resistance of about 12.2 Ohm/sq. In an embodiment, after the annealing, the transparent conductive material according to the present disclosure has a transmission at 1550 nm of about 82.4% and a sheet resistance of about 22 Ohm/sq.

In some embodiments of the method for modulating resistivity and/or NIR transmission of a transparent conductive material, after the annealing, the transparent conductive material according to the present disclosure has a transmission at 1550 nm of about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, or about 85%, or any value thereinbetween, and/or a Haacke FoM of at least about 5×10$^{-4}\Omega^{-1}$, at least about 10×10$^{-4}\Omega^{-1}$, at least about 15×10$^{-4}\Omega^{-1}$, at least about 20×10$^{-4}\Omega^{-1}$, at least about 25×10$^{-4}\Omega^{-1}$, at least about 30×10$^{-4}\Omega^{-1}$, at least about 35×10$^{-4}\Omega^{-1}$, at least about 40×10$^{-4}\Omega^{-1}$, at least about 45×10$^{-4}\Omega^{-1}$, at least about 50×10$^{-4}\Omega^{-1}$, at least about 55×10$^{-4}\Omega^{-1}$, at least about 60×10$^{-4}\Omega^{-1}$, at least about 65×10$^{-4}\Omega^{-1}$, at least about 70×10$^{-4}\Omega^{-1}$, at least about 75×10$^{-4}\Omega^{-2}$, or at least about 80×10$^{-4}\Omega^{-1}$, or any range therein.

In some embodiments of the method for modulating resistivity and/or NIR transmission of a transparent conductive material, after the annealing, the transparent conductive material according to the present disclosure has a transmission at 1550 nm of about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, or about 85%, or any value thereinbetween, and/or a Haacke FoM of about 5×10$^{-4}\Omega^{-1}$, about 10×10$^{-4}\Omega^{-1}$, about 15×10$^{-4}\Omega^{-1}$, about 20×10$^{-4}\Omega^{-1}$, about $25 \times 10^{-4} \Omega^{-1}$, about $30 \times 10^{-4} \Omega^{-1}$, about $35 \times 10^{-4} \Omega^{-1}$, about $40 \times 10^{-4} \Omega^{-1}$, about $45 \times 10^{-4} \Omega^{-1}$, about $50 \times 10^{-4} \Omega^{-1}$, about $55 \times 10^{-4} \Omega^{-1}$, about $60 \times 10^{-4} \Omega^{-1}$, about $65 \times 10^{-4} \Omega^{-1}$, about $70 \times 10^{-4} \Omega^{-1}$, about $75 \times 10^{-4} \Omega^{-1}$, or about $80 \times 10^{-4} \Omega^{-1}$, or any value thereinbetween.

In an embodiment, after the annealing, the transparent conductive material according to the present disclosure has a transmission at 1550 nm of about 82.4% and a Haacke FoM of about $64.2 \times 10^{-4} \Omega^{-1}$. In another embodiment, after the annealing, the transparent conductive material according to the present disclosure has a transmission at 1550 nm of about 63.9% and a Haacke FoM of about $9.3 \times 10^{-4} \Omega^{-1}$.

In still other embodiments, the present disclosure relates to an article comprising a layer of a transparent conductive material, wherein the layer of the transparent conductive material exhibits an improved trade-off between resistivity and near infrared (NIR) transmission (750-2400 nm). In some embodiments, the layer of the transparent conductive material has a transmission of at least about 80%, at least about 75%, at least about 70%, at least about 65%, or at least about 60% at 1550 nm, and/or a resistivity of no greater than about $5 \times 10^4$ Ohm-cm, no greater than about $4.5 \times 10^{-4}$ Ohm-cm, no greater than about $4 \times 10^{-4}$ Ohm-cm, no greater than about $3.5 \times 10^{-4}$ Ohm-cm, no greater than about $3 \times 10^{-4}$ Ohm-cm, no greater than about $2.5 \times 10^{-4}$ Ohm-cm, no greater than about $2 \times 10^{-4}$ Ohm-cm, no greater than about $1.5 \times 10^{-4}$ Ohm-cm, or no greater than about $1 \times 10^{-4}$ Ohm-cm, or any range therein.

In some embodiments, the layer of the transparent conductive material has a transmission at 1550 nm of about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, or about 85%, or any value thereinbetween, and/or a resistivity of about $1 \times 10^{-4}$ Ohm-cm, about $1.2 \times 10^{-4}$ Ohm-cm, about $1.4 \times 10^{-4}$ Ohm-cm, about $1.6 \times 10^{-4}$ Ohm-cm, about $1.8 \times 10^{-4}$ Ohm-cm, about $2.0 \times 10^{-4}$ Ohm-cm, about $2.2 \times 10^{-4}$ Ohm-cm, about $2.4 \times 10^{-4}$ Ohm-cm, about $2.6 \times 10^{-4}$ Ohm-cm, about $2.8 \times 10^{-4}$ Ohm-cm, about $3.0 \times 10^{-4}$ Ohm-cm, about $3.5 \times 10^{-4}$ Ohm-cm, about $4.0 \times 10^{-4}$ Ohm-cm, about $4.5 \times 10^{-4}$ Ohm-cm, or about $5.0 \times 10^{-4}$ Ohm-cm, or any value thereinbetween.

In some embodiments, the layer of the transparent conductive material according to the present disclosure has a transmission at 1550 nm of about 63.9% to about 82.4% and a resistivity of about $1.2 \times 10^{-4}$ Ohm-cm to about $2.2 \times 10^{-4}$ Ohm-cm. In an embodiment, the transparent conductive material according to the present disclosure has a transmission at 1550 nm of about 63.9% and a resistivity of about $1.2 \times 10^{-4}$ Ohm-cm. In an embodiment, the transparent conductive material according to the present disclosure has a transmission at 1550 nm of about 82.4% and a resistivity of about $2.2 \times 10^{-4}$ Ohm-cm.

In some embodiments, the layer of the transparent conductive material according to the present disclosure exhibits and improved trade-off between sheet resistance and near infrared (NIR) transmission (750-2400 nm). In some embodiments, the transparent conductive material has a transmission of at least about 80%, at least about 75%, at least about 70%, at least about 65%, or at least about 60% at 1550 nm, or any range therein, and/or a sheet resistance of no greater than about 50 Ohm/sq., no greater than about 45 Ohm/sq., no greater than about 40 Ohm/sq., no greater than about 35 Ohm/sq., no greater than about 30 Ohm/sq., no greater than about 25 Ohm/sq., no greater than about 20 Ohm/sq., no greater than about 15 Ohm/sq., or no greater than about 10 Ohm/sq., or any range therein.

In some embodiments, the layer of the transparent conductive material has a transmission at 1550 nm of about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, or about 85%, or any value thereinbetween, and/or a sheet resistance of about 10 Ohm/sq., about 12 Ohm/sq., about 14 Ohm/sq., about 16 Ohm/sq., about 18 Ohm/sq., about 20 Ohm/sq., about 22 Ohm/sq., about 24 Ohm/sq., about 26 Ohm/sq., about 28 Ohm/sq., about 30 Ohm/sq., about 35 Ohm/sq., about 40 Ohm/sq., about 45 Ohm/sq., or about 50 Ohm/sq., or any value thereinbetween.

In some embodiments, the layer of the transparent conductive material according to the present disclosure has a transmission at 1550 nm of about 63.9% to about 82.4% and a sheet resistance of about 12.2 Ohm/sq. to about 22 Ohm/sq. In an embodiment, the transparent conductive material according to the present disclosure has a transmission at 1550 nm of about 63.9% and a sheet resistance of about 12.2 Ohm/sq. In an embodiment, the transparent conductive material according to the present disclosure has a transmission at 1550 nm of about 82.4% and a sheet resistance of about 22 Ohm/sq.

In some embodiments of the method, the layer of the transparent conductive material according to the present disclosure has a transmission at 1550 nm of about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, or about 85%, or any value thereinbetween, and/or a Haacke FoM of at least about $5 \times 10^{-4} \Omega^{-1}$, at least about $10 \times 10^{-4} \Omega^{-1}$, at least about $15 \times 10^{-4} \Omega^{-1}$, at least about $20 \times 10^{-4} \Omega^{-1}$, at least about $25 \times 10^{-4} \Omega^{-1}$, at least about $30 \times 10^{-4} \Omega^{-1}$, at least about $35 \times 10^{-4} \Omega^{-1}$, at least about $40 \times 10^{-4} \Omega^{-1}$, at least about $45 \times 10^{-4} \Omega^{-1}$, at least about $50 \times 10^{-4} \Omega^{-1}$, at least about $55 \times 10^{-4} \Omega^{-1}$, at least about $60 \times 10^{-4} \Omega^{-1}$, at least about $65 \times 10^{-4} \Omega^{-1}$, at least about $70 \times 10^{-4} \Omega^{-1}$, at least about $75 \times 10^{-4} \Omega^{-2}$, or at least about $80 \times 10^{-4} \Omega^{-1}$, or any range therein.

In some embodiments, the layer of the transparent conductive material according to the present disclosure has a transmission at 1550 nm of about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, or about 85%, or any value thereinbetween, and/or a Haacke FoM of about $5 \times 10^{-4} \Omega^{-1}$, about $10 \times 10^{-4} \Omega^{-1}$, about $15 \times 10^{-4} \Omega^{-1}$, about $20 \times 10^{-4} \Omega^{-1}$, about $25 \times 10^{-4} \Omega^{-1}$, about $30 \times 10^{-4} \Omega^{-1}$, about $35 \times 10^{-4} \Omega^{-1}$, about $40 \times 10^{-4} \Omega^{-1}$, about $45 \times 10^{-4} \Omega^{-1}$, about $50 \times 10^{-4} \Omega^{-1}$, about $55 \times 10^{-4} \Omega^{-1}$, about $60 \times 10^{-4} \Omega^{-1}$, about $65 \times 10^{-4} \Omega^{-1}$, about $70 \times 10^{-4} \Omega^{-1}$, about $75 \times 10^{-4} \Omega^{-1}$, or about $80 \times 10^{-4} \Omega^{-1}$, or any value thereinbetween.

In an embodiment, the layer of the transparent conductive material according to the present disclosure has a transmission at 1550 nm of about 82.4% and a Haacke FoM of about $64.2 \times 10^{-4} \Omega^{-1}$. In another embodiment, the transparent conductive material according to the present disclosure has a transmission at 1550 nm of about 63.9% and a Haacke FoM of about $9.3 \times 10^{-4} \Omega^{-1}$.

In some embodiments, the layer of the transparent conductive material also maintains a high transmission over the visible wavelength range (380-750 nm). In some embodiments, the transparent conductive material has a transmission in the visible range of at least 75%, at least 76%, at least 77%, at least 78%, at least 79%, at least 80%, at least 81%, at least 82%, at least 83%, at least 84%, or at least 85%, or any range or value thereinbetween. In an embodiment, the transparent conductive material has a transmission in the visible range of about 83.9%.

In some embodiments, the transparent conductive material according to the present disclosure is indium tin oxide (ITO), zinc oxide (ZnO), antimony-doped zinc oxide (AZO) antimony-doped tin oxide (ATO), fluorine-doped tin oxide (FTO), gallium-doped zinc oxide (GZO), molybdenum-doped indium oxide (IMO), or magnesium-doped zinc oxide (MZO), or other like materials, or combinations or mixtures thereof. In some embodiments, the transparent conductive material is ITO.

In some embodiments, the layer of the transparent conductive material may be formed on or deposited onto a substrate. The substrate of the present disclosure may be planar (e.g., a silicon wafer or fused silica substrate), or it may be of any other shape or dimension appropriate for forming an article. In some embodiments, the substrate may comprise microparticles or nanoparticles, which may take the form or shape of spheres, prisms, wires, rods cubes, or any other shape. Substrates according the present disclosure may include ceramics, glasses, metals, or semiconductors. In an embodiment, the substrate according to the present disclosure is fused silica.

In some embodiments, the thickness of the layer of the transparent conductive material may be selected to facilitate achieving either low resistivity (or low sheet resistance), high NIR transmission, or both. In some embodiments, the transparent conductive material has a thickness between about 10 nm and about 1000 nm, between about 15 nm and about 500 nm, between about 20 nm and about 250 nm, between about 50 nm and about 150 nm, or between about 75 nm and about 125 nm, or any range or value thereinbetween. In some embodiments, the transparent conductive material has a thickness of about 10 nm, about 15 nm, about 20 nm, about 30 nm, about 40 nm, about 50 nm, about 60 nm, about 70 nm, about 80 nm, about 90 nm, about 100 nm, about 110 nm, about 120 nm, about 130 nm, about 140 nm, about 150 nm, about 160 nm, about 170 nm, about 180 nm, about 190 nm, about 200 nm, about 250 nm, about 300 nm, about 350 nm, about 400 nm, about 450 nm, about 500 nm, about 550 nm, about 600 nm, about 650 nm, about 700 nm, about 750 nm, about 800 nm, about 850 nm, about 900 nm, about 950 nm, or about 1000 nm, or any value thereinbetween.

Embodiments according to the present disclosure will be described more fully hereinafter. Aspects of the disclosure may, however, be embodied in different forms and should not be construed as limited to the embodiments set forth herein. Rather, these embodiments are provided so that this disclosure will be thorough and complete, and will fully convey the scope of the technology to those skilled in the art.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the present application and relevant art and should not be interpreted in an idealized or overly formal sense unless expressly so defined herein. While not explicitly defined below, such terms should be interpreted according to their common meaning.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member. Thus, for example, a group having 1-3 layers refers to groups having 1, 2, or 3 layers. Similarly, a group having 1-5 layers refers to groups having 1, 2, 3, 4, or 5 layers, and so forth.

Unless the context indicates otherwise, it is specifically intended that the various features of the invention described herein can be used in any combination. Moreover, the disclosure also contemplates that in some embodiments, any feature or combination of features set forth herein can be excluded or omitted. To illustrate, if the specification states that a complex comprises components A, B and C, it is specifically intended that any of A, B or C, or a combination thereof, can be omitted and disclaimed singularly or in any combination.

Unless explicitly indicated otherwise, all specified embodiments, features, and terms intend to include both the recited embodiment, feature, or term and biological equivalents thereof.

All patents, patent applications, provisional applications, and publications referred to or cited herein are incorporated by reference in their entirety, including all figures and tables, to the extent they are not inconsistent with the explicit teachings of this specification.

The following examples are given for the purpose of illustrating various embodiments of the disclosure and are not meant to limit the present disclosure in any fashion. One skilled in the art will appreciate readily that the present disclosure is well adapted to carry out the objects and obtain the ends and advantages mentioned, as well as those objects, ends and advantages inherent herein. The present examples, along with the methods described herein are presently representative of embodiments and are exemplary, and are not intended as limitations on the scope of the disclosure. Changes therein and other uses which are encompassed within the spirit of the disclosure as defined by the scope of the claims will occur to those skilled in the art. It is to be understood that this present technology is not limited to particular methods, reagents, compounds compositions or biological systems, which can, of course, vary. The terminology used in the description herein is for the purpose of describing particular embodiments only and is not intended to be limiting.

EXAMPLES

Example 1: Preparation and Characterization of ITO Films

Deposition by RF Sputtering. ITO films of thickness 100 nm were deposited onto fused silica substrates via RF sputtering at room temperature. Double-sided, optically polished, ultraviolet-fused silica glass substrates, with a thickness of 1 mm and an area of 1-in$^2$ were cleaned by ultrasonication in an acetone bath for 10 min, followed by ultrasonication in an ethanol bath for 10 min. The substrates were then rinsed in deionized water and dried with a stream of nitrogen gas.

The ITO was deposited by magnetron sputtering. The sputtering chamber was initially evacuated to a base pressure of approximately $10^{-7}$-$10^{-8}$ Torr. To improve film adhesion to the substrate, low-power argon plasma cleaning was performed for 15 min. inside the sputtering chamber prior to deposition, using Ar gas (20 sccm) at a pressure of 8 mTorr and using a bias power of 40 W.

An ITO (99.99%) sputtering target (Kurt J. Lesker Co.) was used for depositing ITO films with DC power of 60 W and working pressure of 2 mTorr. The deposition was conducted under an Ar/O$_2$ gas mixture (flux ratio of 20:1) at room temperature. The target-to-substrate distance was maintained at 30 cm, and the substrate holder was rotated during deposition at a speed of 60 rpm. The deposition rate was 0.694 Å s$^{-1}$.

High-Temperature Annealing. The as-deposited ITO films (Example 1a) were removed from the sputtering chamber and were annealed in a RTP-150-HV rapid thermal process oven (UniTemp, GmBH) at 750° C. under a nitrogen gas ambient. The effective total annealing time was varied from 15 min to 10 hr (Examples 1c-1j). Although the samples in Examples 1c-1j were annealed at 750° C., the high temperature annealing (HTA) process may be carried out at temperatures from about 450° C. to about 850° C. and for annealing times of, for example 2 min to 10 hr, or longer.

Prior to annealing, the process chamber was iteratively purged (12-20 L min$^{-1}$) with nitrogen gas and evacuated, which sequence was repeated 3 times to ensure oxygen-free conditions inside the process chamber. During annealing, the N$_2$ flow was reduced to 2 L min$^{-1}$. Upon completion of the annealing time, the N$_2$ flow was increased to 10 L min$^{-1}$ to expedite cooling of the process chamber. FIG. 1 shows a typical process flow diagram from a 2-hr high-temperature annealing process.

Low-Temperature Annealing. ITO films prepared according to the above magnetron sputtering procedure were also annealed at low temperature for comparison to HTA-ITO. In the LTA process, the bare ITO films are annealed on a hotplate at 200° C. for 1 hr, then allowed to cool, in room ambient atmosphere (Example 1b).

Film Characterization. The electrical properties of the ITO films were measured according to the four-point probe method using a Cascade Microtech 44/7 S 2749 probe station connected to a Keithley 2001 multimeter. Typically, R$_s$ represents an average of six different measurements, each recorded at a different position on the film.

Film surface morphology was investigated by AFM (Bruker Dimension FastScan D3100) using a lateral resolution of <7 nm, and field-emission SEM (Zeiss 1550VP). A spectrophotometer (Perkin Elmer LAMBDA 950) was used for optical spectra measurements in the visible and near-infrared wavelength ranges.

Comparative Examples 1-9: Deposition Conditions for ITO Films

Table 1 below summarizes conditions used to prepare Comparative Examples 1-9, which are all ITO materials produced by physical vapor deposition processes.

TABLE 1

ITO Film Deposition Conditions for Comparative Examples 1-9.

| Material | Annealing Conditions |
|---|---|
| Comparative Example 1 | Ion assisted Deposition using a Veeco horizontal dual-gun IAD system at room temperature. ITO targets In$_2$O$_3$:SnO$_2$ = 9:1 were purchased from Sputtering Materials, Inc. |
| Comparative Example 2 | Sputtering: The target dimensions were 130 × 20 cm$^2$. The target used for these evaluations was a ceramic target containing 10 wt % SnO$_2$ and 90 wt % In$_2$O$_3$. The deposition was carried out an argon atmosphere. Argon and oxygen gas flows were controlled by mass flow controllers Power: 4.3 KW; 6.1 sccm oxygen flow. |
| Comparative Example 3 | RF sputtering: flow rates of 36 sccm Ar and 0.2 sccm O$_2$, chamber pressure of 5 mTorr, and deposition rate of ~2 Å/s. |
| Comparative Example 4 | Deposition of ITO thin films was performed by using vacuum coating unit equipped with an electron beam evaporation system. The source evaporation material was an ITO pellet (Aldrich) with composition of 90 wt. % In$_2$O$_3$ and 10 wt. % of SnO$_2$. Prior to starting deposition, a steady-state chamber pressure of about 2.6 × 10$^{-3}$ Pa (base pressure) was reached. Oxygen (99.99%) was introduced into the deposition system from a steel tube through a calibrated leak valve. The working pressure during the film deposition was fixed at 1 × 10$^{-2}$ Pa by adjusting the needle valve for the ultrapure oxygen gas flow. The deposition rate (0.2 nm/s) and the film thickness were controlled and monitored during the evaporation process by using a quartz crystal sensor (Model, TM-350 MAXTEK, Inc., USA). The films thus obtained were thermally annealed at temperatures of 300° C. and 600° C. in air atmosphere under dark conditions for 1 hr. |
| Comparative Example 5 | ITO thin films were prepared by RF sputtering using a ceramic ITO target in pure argon atmosphere at a high base pressure of 3 × 10$^{-4}$ mbar without substrate heating and oxygen admittance. The pressure during deposition was 1.2 × 10$^{-2}$ mbar or less. Pure argon (99.99%) was delivered to the chamber at a flux of 16 sccm. The substrate-to-target distance was 13 cm. Two different sputtering powers, 100 W and 200 W, were used, The films were subsequently annealed in air in the temperature range 100-400° C. |
| Comparative Example 6 | Magnetron sputtering: After evacuation of the chamber, 26 sccm Ar and 1 sccm O$_2$ gases were admitted using a mass flow controller, to maintain the working gas pressure at about 5.6 × 10$^{-3}$ mbar. Then, 350 W DC power (ADL Maris, 10 kW) was applied to generate the plasma on the 50 × 20 cm$^2$ ITO target (purity of 99.99% and 10 wt. % SnO$_2$, 90 wt. % In$_2$O$_3$). During the ITO thin film deposition, we moved the sample holder at 3.0 cm/min, and ITO thin films with the thickness of 256 nm were grown at 250° C. substrate temperature. Electro-annealing was |

TABLE 1-continued

ITO Film Deposition Conditions for Comparative Examples 1-9.

| Material | Annealing Conditions |
|---|---|
| | performed by applying 0.75, 1.00, 1.25 and 1.50 A constant AC currents to the ITO thin films in vacuum and air for 10 min. The ITO thin film temperature increased during electro-annealing for 10 min and then naturally decreased to the room temperature within between 20 and 40 min after annealing currents were switched off. |
| Comparative Example 7 | The ITO films were deposited onto glass substrates by electron beam evaporation (Denton DVB SJ-26C) and ion-assisted deposition using a starting material of ITO tablet with a composition of 90 wt % In2O3 and 10 wt % SnO2 (purity of 99.99%). The base pressure of the deposition chamber was $6 \times 10^{-6}$ mbar while the pressure during evaporating process was about $6 \times 10^{-5}$ mbar. The pure oxygen (99.99%) was flowed through the End-Hall ion source (Hanil Vacuum Inc.) and it was kept constant at 12 sccm by mass flow controller. The angle between the incident oxygen ion beam and the normal of the substrate was fixed at 45°. The distance between the evaporating source and the rotating substrate holder was fixed at 60 cm. The substrate temperature during the deposition process was maintained at 150° C. by quartz lamp irradiation. The thickness of deposited films was controlled using a quartz crystal thickness monitor in order to obtain a film thickness of 500 nm with an evaporating rate of 2 Å/s. After the deposition process, ITO films were annealed in the air at 200, 250, 300 and 350° C. for 1 h |
| Comparative Example 8 | In this work, an E-beam evaporation system equipped with an end-hall ion source was used to generate oxygen ion beam for ITO thin films deposition. The material used was ITO pellets with a composition of 90 wt. % $In_2O_3$ and 10 wt. % $SnO_2$. The ion gun voltage was maintained at 120 V and ion gun current was controlled at 1 A. Base pressure is $5 \times 10^{-6}$ mTorr, and oxygen flow rate from mass flow controller through the ion gun was set at 8 sccm. Operating pressure was $3 \times 10^{-5}$ mTorr. During deposition, the substrate temperature increased from room temperature to 70° C. and the substrate holder was rotated at a speed of 30 rpm. The deposition rate was fixed at 0.15 nm/s by a quartz crystal monitor. After deposition process, the samples were annealed in a tube furnace under alow pressure of $2 \times 10^{-2}$ mTorr for 1 h at 250° C. and 350° C., respectively. |
| Comparative Example 9 | ITO films were prepared on substrates kept at room temperature by activated reactive evaporation. The starting materials were 90 wt. % In and 10 wt. % Sn. The purity of each metal was 99.999%. A resistively heated molybdenum boat was used to evaporate the material, in a conventional vacuum system. The evaporation was carried out in the presence of oxygen plasma. The vacuum chamber was first evacuated to a pressure of $10^{-5}$ m.bar. Industrial grade oxygen was admitted into the chamber, through a needle valve, to a pressure of $5 \times 10^{-3}$ mbar. The anode supply was turned on, initiating the glow discharge. A bluish glow filled the whole chamber, and a steady discharge current was maintained. The indium and tin placed in the molybdenum boat were evaporated in the oxygen plasma. A slight adjustment of the needle valve was necessary to maintain the oxygen pressure at $5 \times 10^{-3}$ mbar. |

Example 2: Structural Analysis of RF-Sputtered ITO Films After High-Temperature Annealing As discussed above, Comparative Examples 1-2 and 4-9 are annealed in uncontrolled atmospheric conditions. To assess the effect of controlled atmospheric conditions and annealing temperature on ITO film morphology, magnetron-sputtered ITO films on fused silica, according to Example 1, were analyzed by SEM and AFM.

Figure 2A:
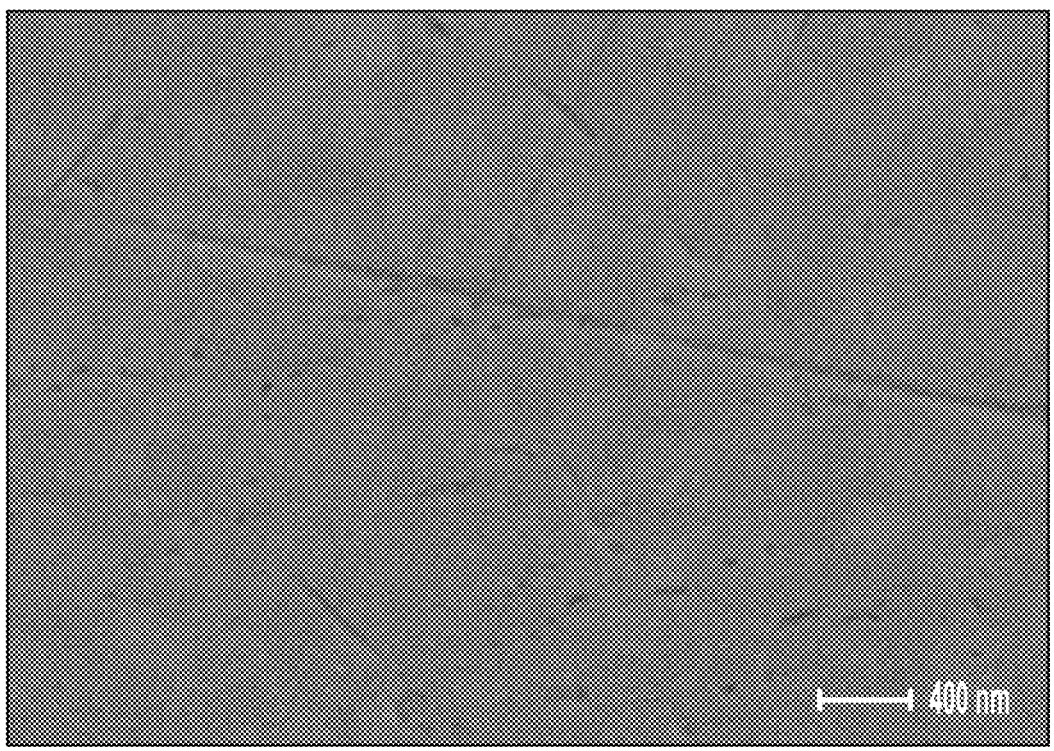
FIG. 2A shows a scanning electron microscope (SEM) image of a low-temperature annealed (LTA) ITO substrate, annealed in ambient atmosphere at 200° C. for 1 hr (Example 1b).
Figure 2B:
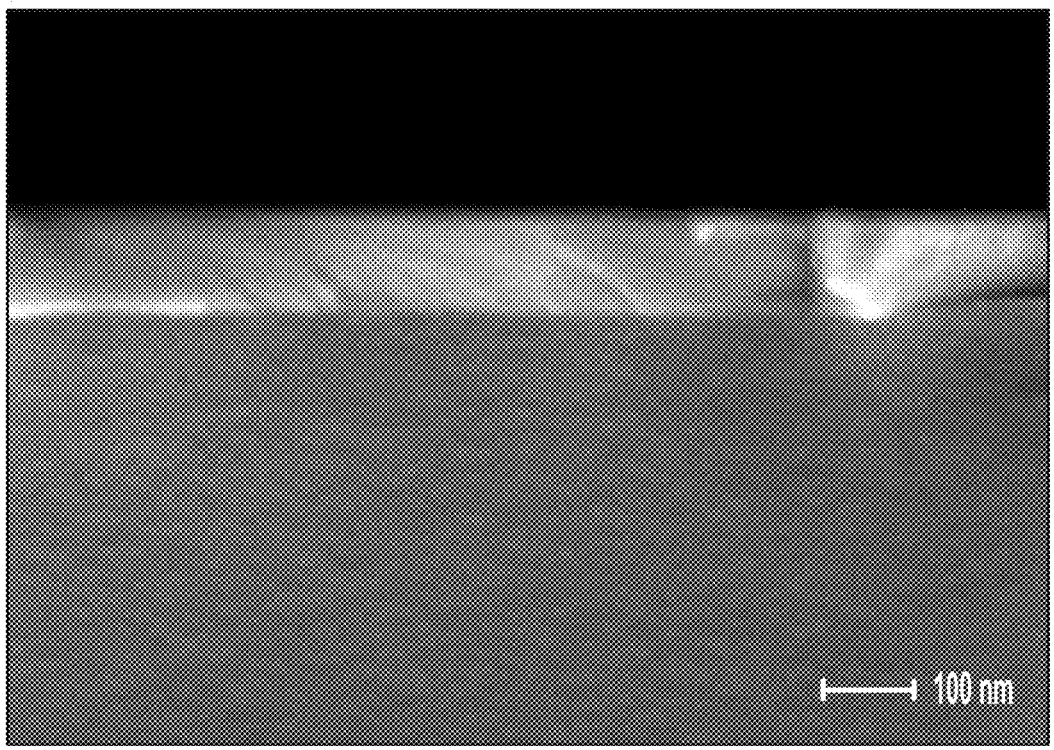
FIG. 2B shows a cross-sectional SEM image of a low-temperature annealed (LTA) ITO substrate, annealed in ambient atmosphere at 200° C. for 1 hr (Example 1b).
Figure 3A:
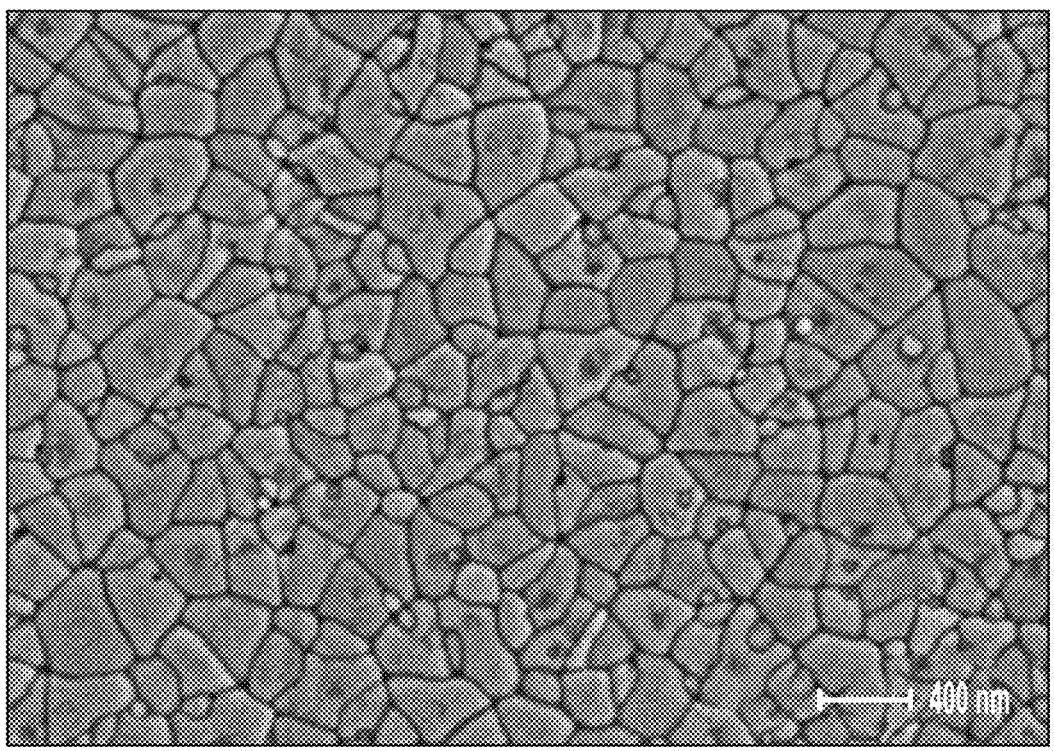
FIG. 3A shows a scanning electron microscope (SEM) image of a high-temperature annealed (HTA) ITO substrate, annealed at 750° C. for 1 hr (Example 1e).
Figure 3B:
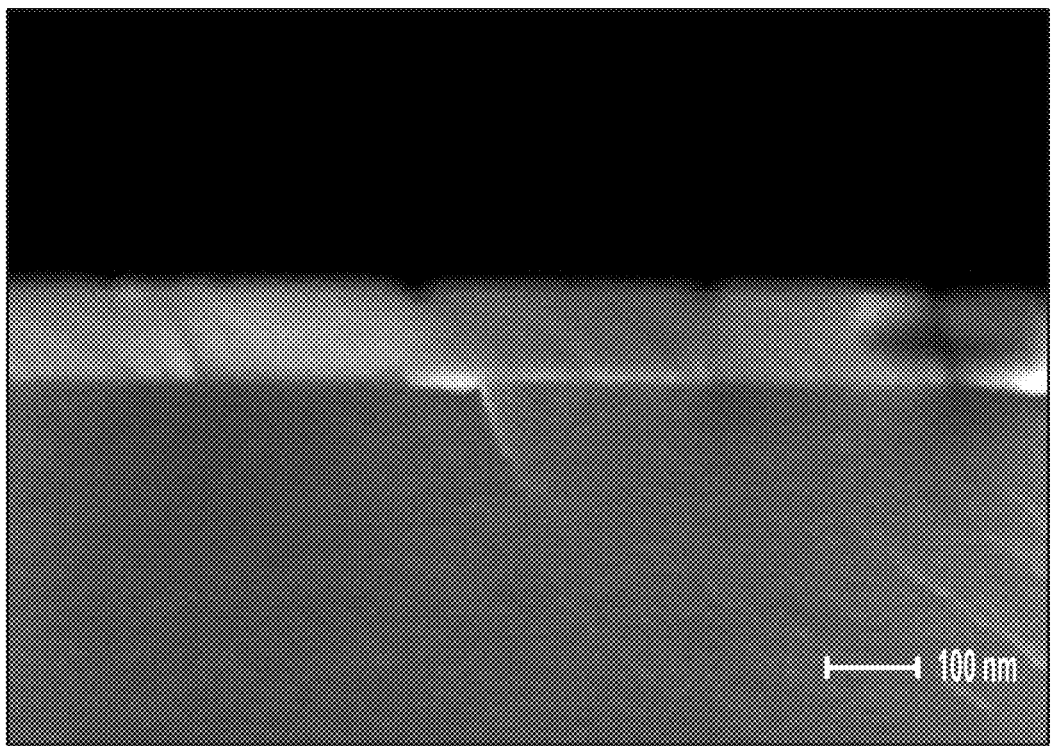
FIG. 3B shows a cross-sectional SEM image of a high-temperature annealed (HTA) ITO substrate, annealed at 750° C. for 1 hr (Example 1e).

Referring now to FIGS. 2-3, SEM images show the differences in surface morphology between ITO films which are low-temperature annealed (LTA) in room ambient atmosphere at 200° C. for 1 hr (FIGS. 2A-B, Example 1b) and ITO films which are high-temperature annealed (HTA), at 750° C. for 1 hr. (FIGS. 3A-B, Example 1e). Top-down and cross-sectional images are shown in FIGS. 2A & 3A and FIGS. 2B & 3B, respectively. The images show that high-temperature annealing leads to thermal grooving.

Figure 4A:
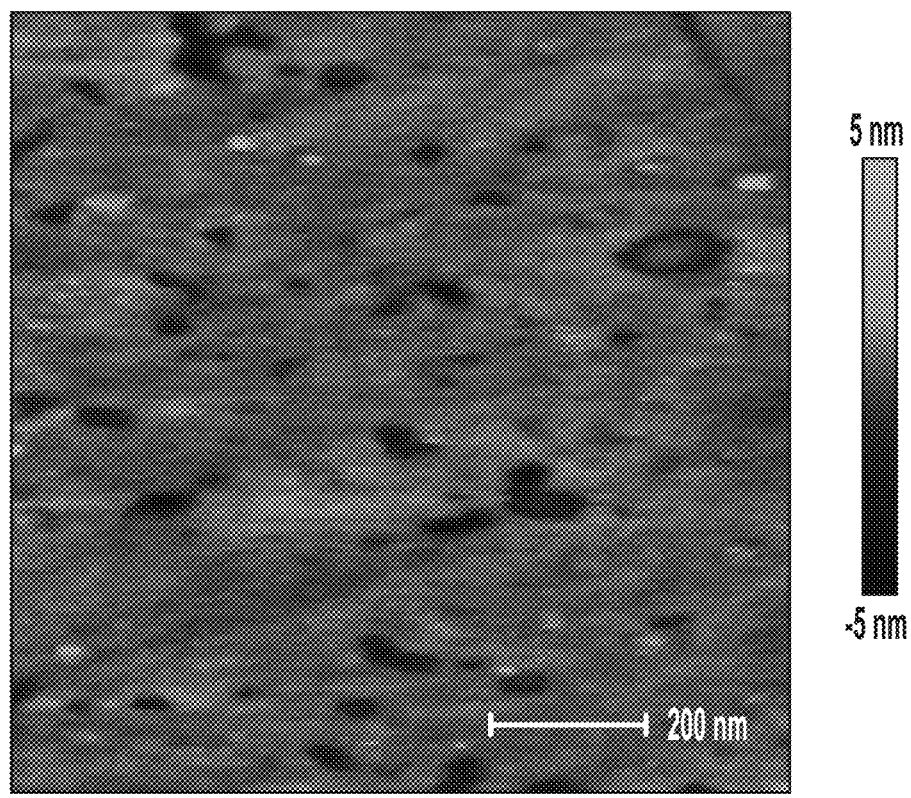
FIG. 4A shows an atomic force microscope (AFM) image of an ITO layer, as deposited by magnetron sputtering onto a fused silica substrate (Example 1a).
Figure 4B:
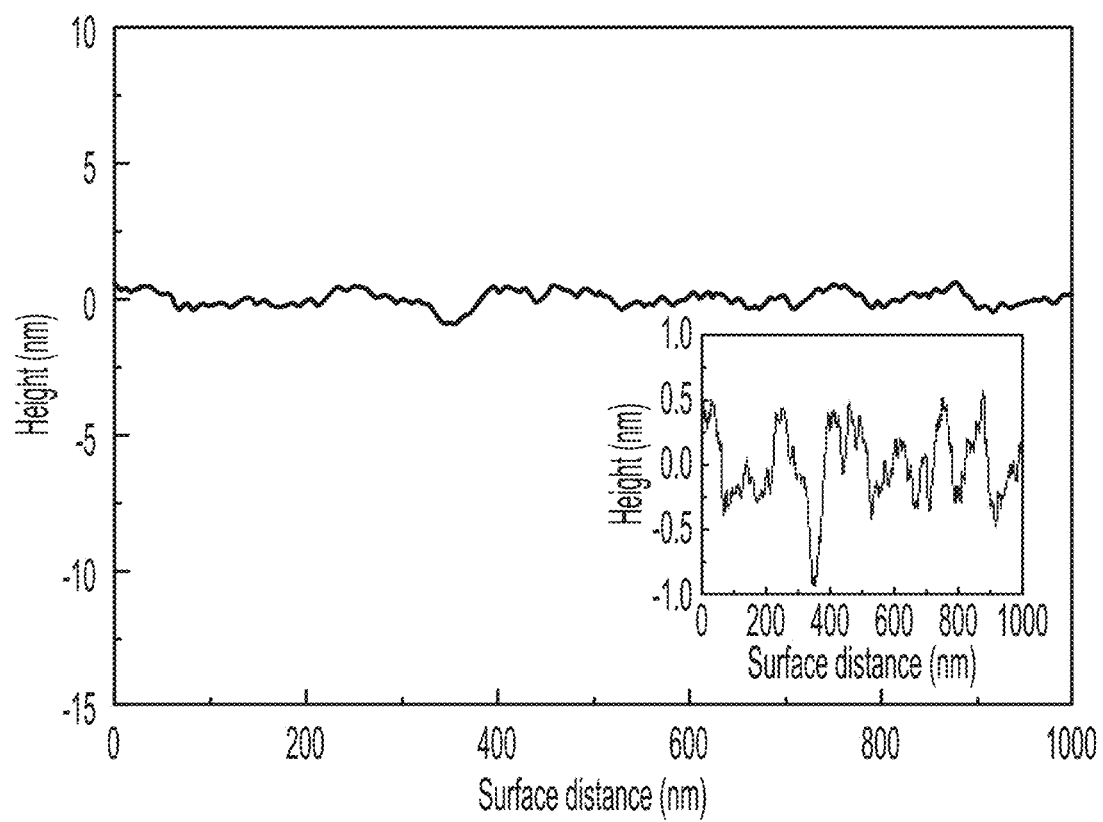
FIG. 4B shows a cross-sectional AFM profile (bottom) of an ITO layer, as deposited by magnetron sputtering onto a fused silica substrate (Example 1a).
Figure 5A:
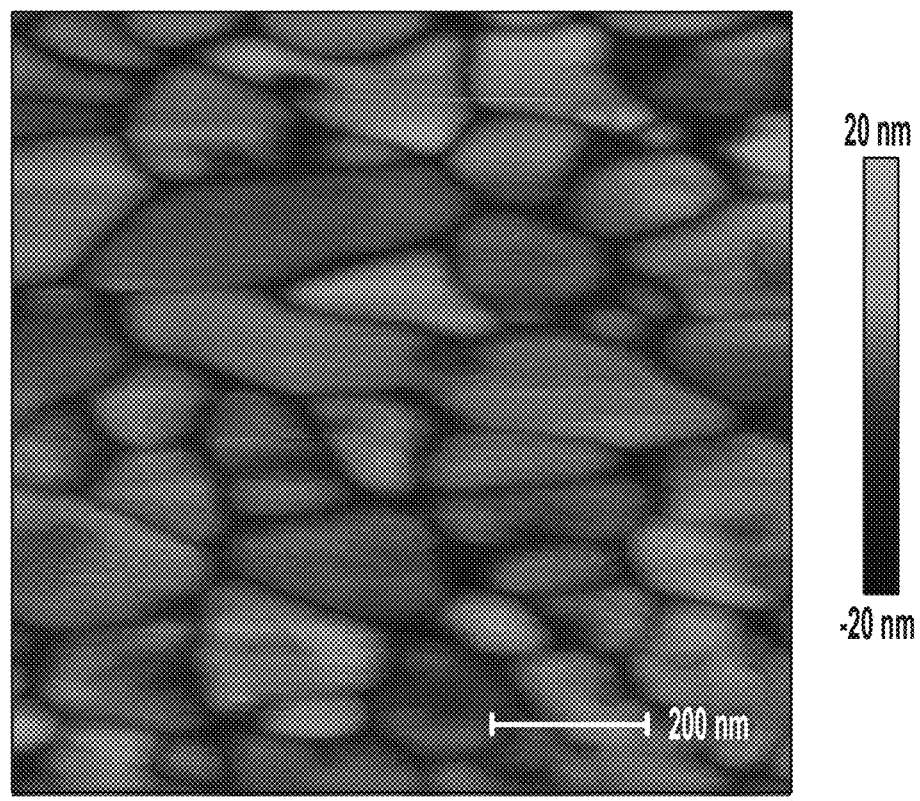
FIG. 5A shows an atomic force microscope (AFM) image of an ITO layer magnetron-sputtered onto a fused silica substrate after high-temperature annealing in nitrogen atmosphere at 750° C. for 1 hr (Example 1e).
Figure 5B:
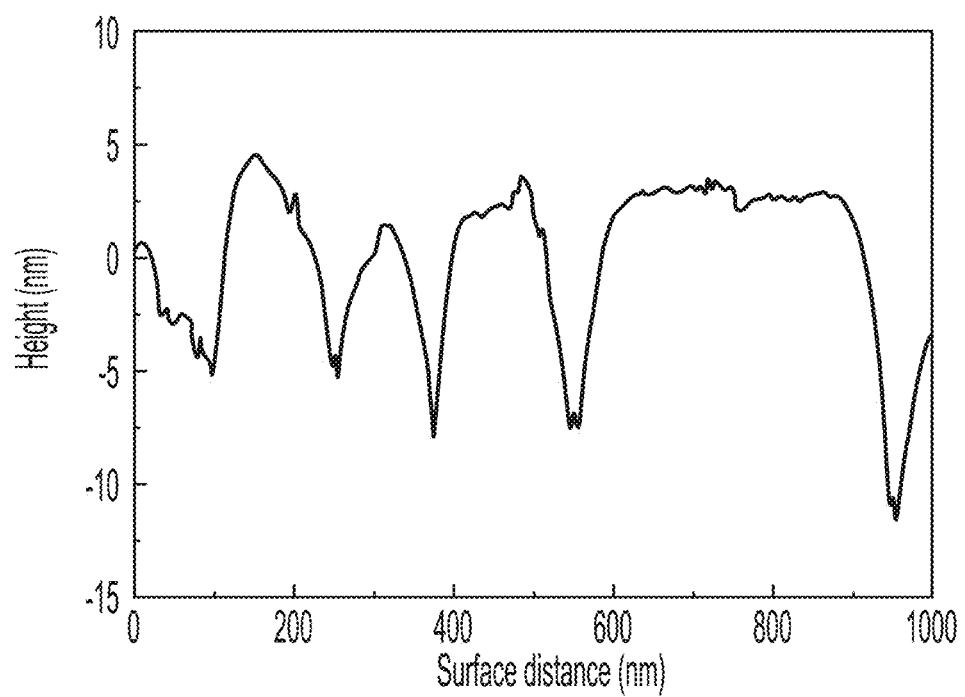
FIG. 5B shows a cross-sectional AFM profile of an ITO layer magnetron-sputtered onto a fused silica substrate after high-temperature annealing in nitrogen atmosphere at 750° C. for 1 hr (Example 1e).

Based on the SEM observation of thermal grooving in HTA-ITO films, the surface morphologies of the films and depth profiles of the cracks were further investigated using atomic force microscopy (AFM). Referring now to FIGS. 4-5, AFM images show that the as-deposited ITO films (Example 1a) are relatively smooth (FIG. 4A, RMS=0.515 nm) compared to the HTA-ITO films (Example 1e, FIG. 5A, RMS=3.43 nm), due to the thermal grooving in HTA-ITO. The depth profiles in FIGS. 4B and 5B show that the HTA annealing produces a nanostructured surface with large grooves with depths up to approximately 10-15 nm or greater (FIG. 5B), while the as-deposited ITO shows no such features (FIG. 4B).

Figure 6:
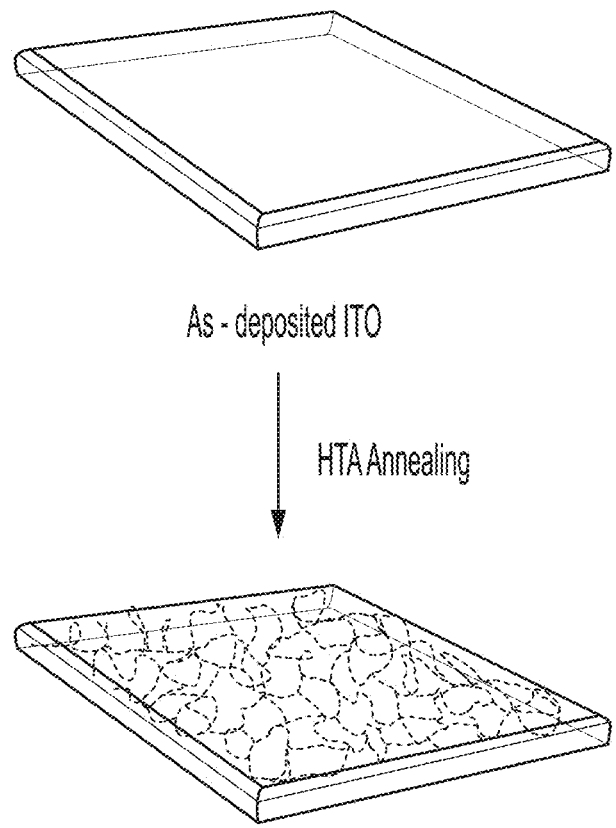
FIG. 6 shows a schematic representation of a high-temperature annealing (HTA) of ITO, wherein the ITO exhibits thermal grooving after annealing.

Referring now to FIG. 6, without being bound to any particular theory, it is believed that the HTA annealing process results in thermal grooving, and that the observed changes in surface morphology for HTA-ITO increase the effective surface area of those films. These surface morphological evolutions may make ITO films advantageous for use in applications such as organic solar cells, where an increase in contact area between the hole transport layer and the ITO anode may eventually increase the hole extraction efficiency and thus permit higher power conversion efficiency.

Example 3: Optical Properties of HTA-ITO Films

To investigate the effect of annealing conditions on the optical properties of LTA and HTA-ITO films, 100-nm ITO films were deposited onto fused silica substrates by magnetron sputtering (Example 1). The films were then characterized by spectrophotometry to determine transmission, reflection, and absorption as a function of annealing time (Examples 1c-1j, from 15 min to 10 hr) at 750° C., as shown in FIGS. 7A, 7B, and 7C, respectively.

Figure 7A:
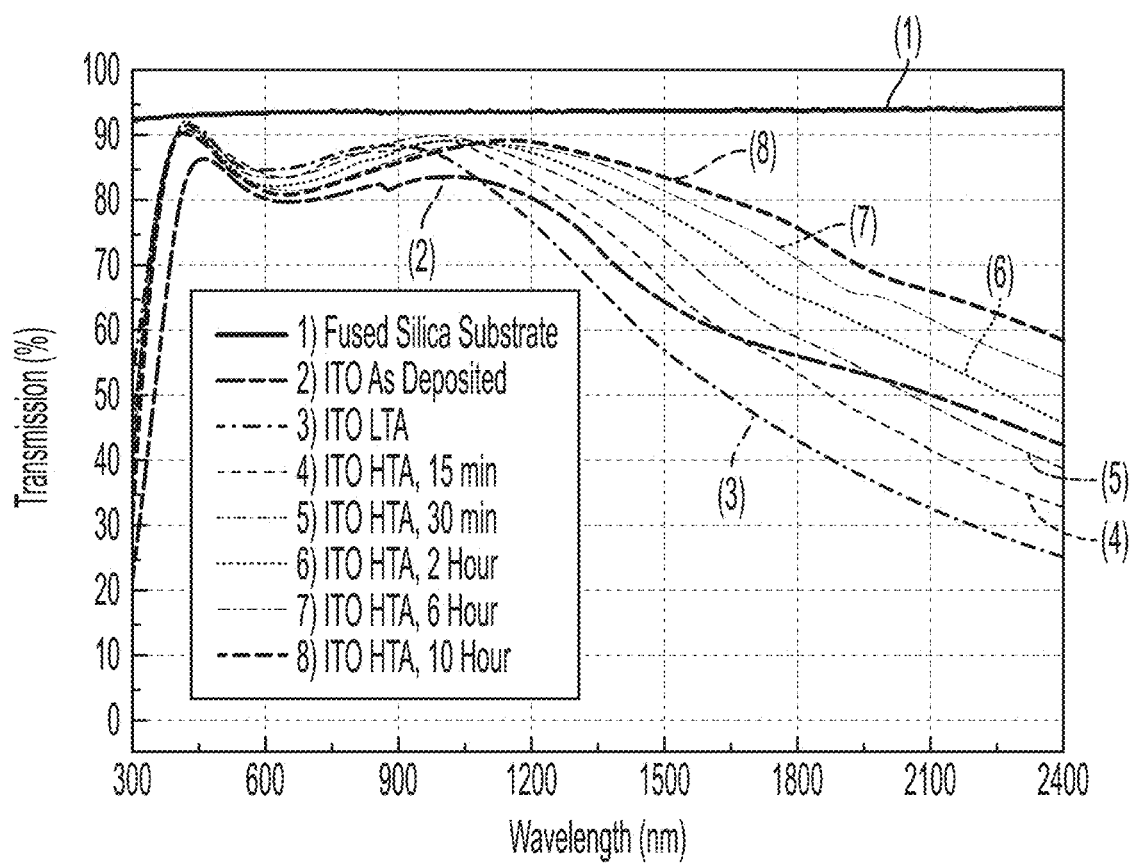
FIG. 7A shows optical transmission spectra of 100-nm ITO films sputtered onto fused silica, according to the present disclosure, as a function of annealing time at 750° C.
Figure 7B:
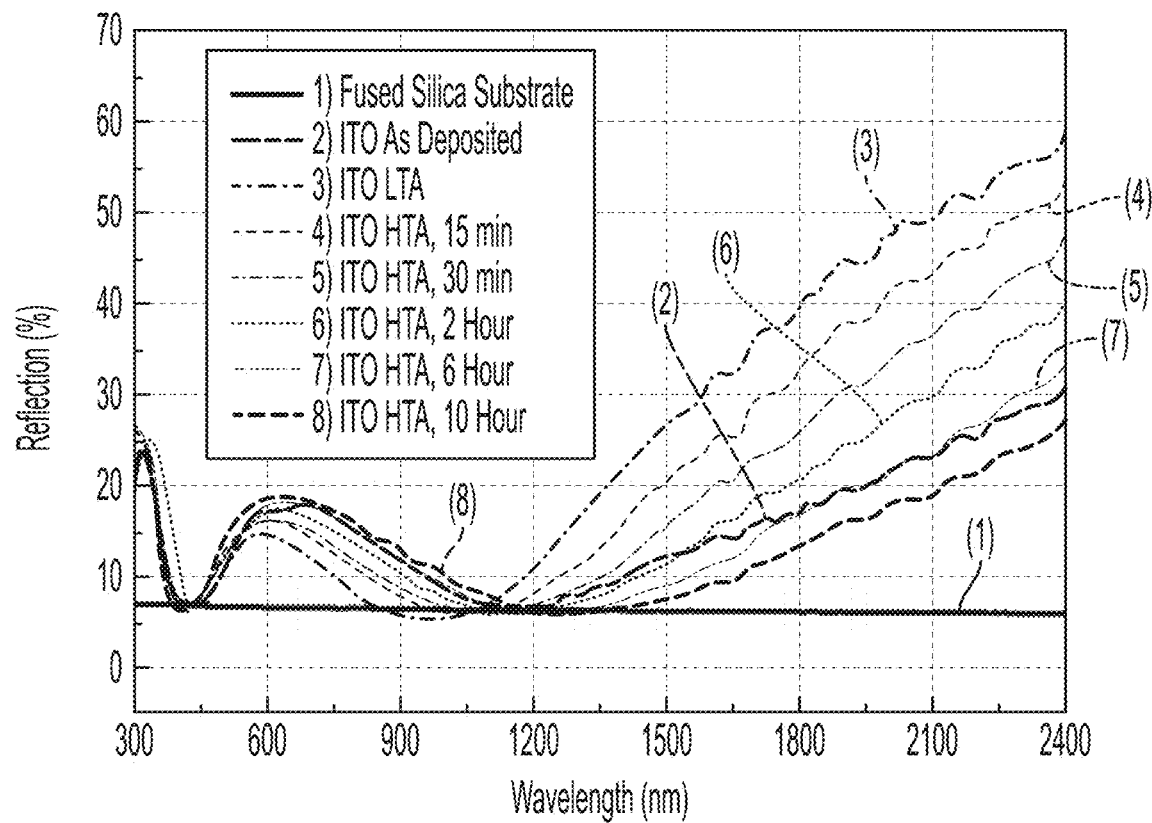
FIG. 7B shows optical reflection spectra of 100-nm ITO films sputtered onto fused silica, according to the present disclosure, as a function of annealing time at 750° C.
Figure 7C:
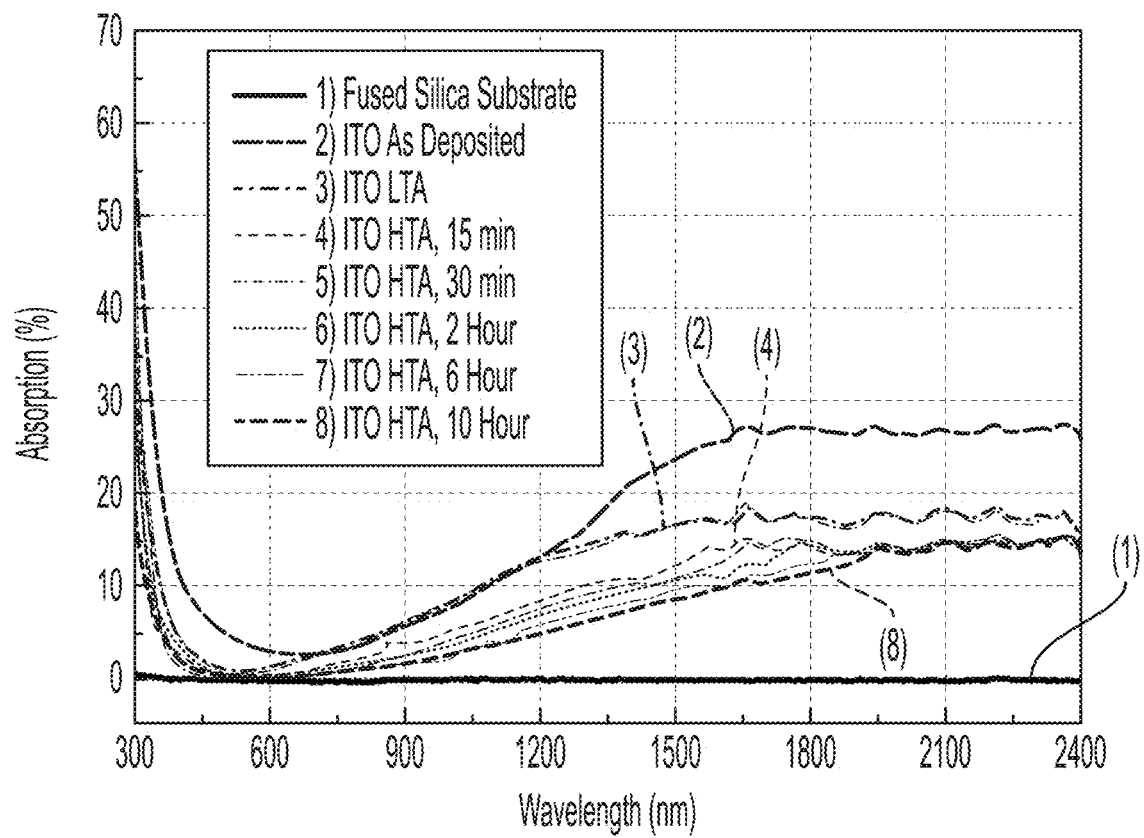
FIG. 7C shows optical absorption spectra of 100-nm ITO films sputtered onto fused silica, according to the present disclosure, as a function of annealing time at 750° C.

FIGS. 7A-C compare the optical spectra of HTA-ITO substrates compared with as-deposited (bare) ITO and LTA-ITO. Based on FIG. 7A, it is clear that the transmission in the near infrared region (750-2400 nm) increases with HTA annealing time. The observed increase in transmission is a function of reduction in reflection (FIG. 7B) and absorption (FIG. 7C) with increased HTA annealing time. Table 2 summarizes the optical characterization data along with sheet resistance data (Example 4).

TABLE 2

Comparison of sheet resistance and transmission for ITO films as a function of annealing time and conditions.

| Sample | Annealing Conditions | Sheet Resistance (Ohm/Sq.) | Transmission (%) 1550 nm | Average Transmission (%) visible (380-750 nm) | Average Transmission (%) near IR (750-2400 nm) |
|---|---|---|---|---|---|
| Example 1a | as-deposited | 32.09 | 62.20 | 81.07 | 64.41 |
| Example 1b | 200° C., 1 hr | 15.74 | 54.39 | 86.89 | 56.3 |
| Example 1c | 750° C., 15 min | 12.24 | 63.93 | 86.04 | 63.71 |
| Example 1d | 750° C., 30 min | 13.88 | 70.71 | 86.29 | 68.13 |
| Example 1e | 750° C., 1 hr | 14.37 | 71.41 | 85.3 | 68.7 |
| Example 1f | 750° C., 2 hr | 15.97 | 76.13 | 85.01 | 72.02 |
| Example 1g | 750° C., 4 hr | 16.99 | 77.75 | 82.68 | 73.07 |
| Example 1h | 750° C., 6 hr | 18.63 | 79.96 | 84.48 | 75.37 |
| Example 1i | 750° C., 8 hr | 20.40 | 81.16 | 84.18 | 76.53 |
| Example 1j | 750° C., 10 hr | 22.31 | 82.35 | 83.85 | 77.81 |

As shown in Table 2, with HTA annealing of 10 hr (Example 1j), a maximum transmission of 82.35% is achieved at the wavelength 1550 nm, with corresponding sheet resistance of 22.3 Ohm/sq. Corresponding average transmissions of 77.81% and 83.85% are achieved in the near-TR (750-2400 nm) and visible (380-750 nm) spectra, respectively. In contrast, after only 15 minutes of HTA annealing (Example 1c), the films exhibited a lower sheet resistance of 12.24 Ohm/sq., a higher average visible transmission of 86.04%, and a lower NIR transmission of 63.71%. Thus, the data in Table 2 demonstrate that the sheet resistance and optical properties can be modulated by altering the HTA duration.

Furthermore, Table 2 compares the data for HTA-ITO with that obtained for LTA-ITO. As compared to the HTA-ITO data, the LTA process affords a higher sheet resistance of 15.74 Ohm/sq., with lower transmission of 86.89% and 56.3% in the visible and near-IR regions, respectively. This comparison underlines the substantial improvement in resistivity and transmission trade-offs that can be achieved with HTA annealing.

Example 4: Comparison of Resistivity, Transmission, and Haacke FoM for HTA-ITO According to the Present Disclosure to Data for Comparative Examples 1-9

Figure 8A:
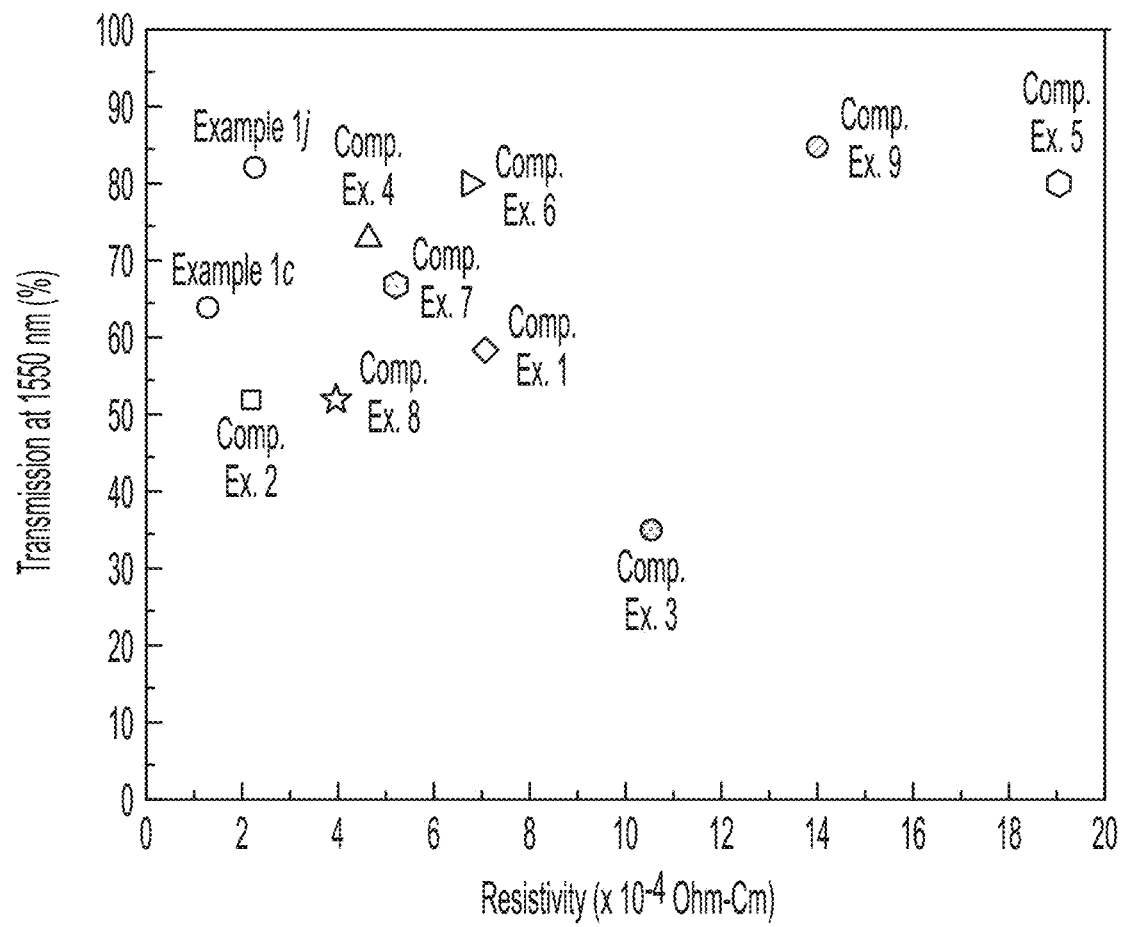
FIG. 8A shows a comparison of transmission at 1550 nm and resistivity for Comparative Examples 1-9 and for HTA-ITO annealed at 750° C. for 15 min and 10 hr, according to the present disclosure.
Figure 8B:
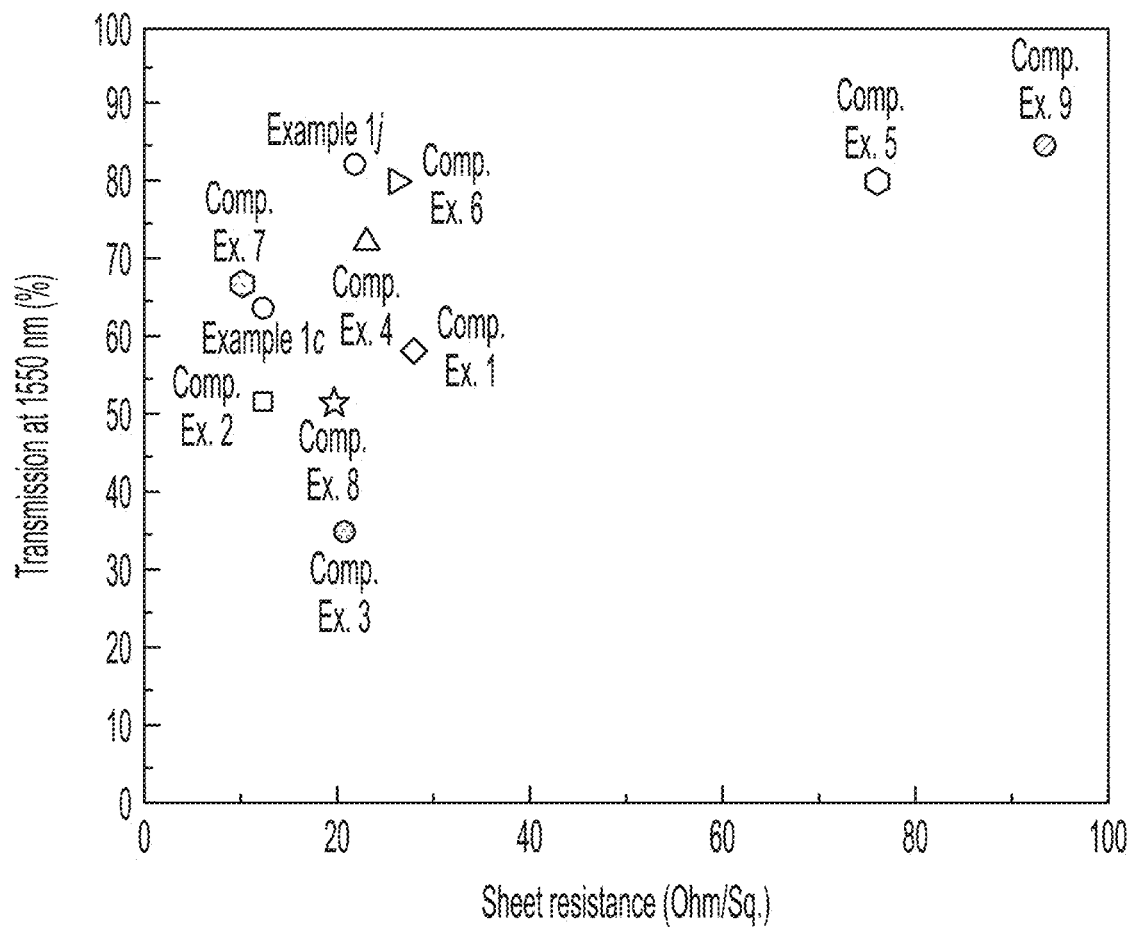
FIG. 8B shows a comparison of transmission at 1550 nm and calculated sheet resistance for Comparative Examples 1-9 and for HTA-ITO annealed at 750° C. for 15 min and 10 hr, according to the present disclosure.

Table 3 compares near IR transmission (1550 nm) and resistivity for Comparative Examples 1-9 to those measured for the HTA-ITO materials of the present disclosure. FIG. 8A plots the transmission data against resistivity. All the NIR transmission values include substrate contribution. However, transmission depends on ITO thickness (because of the thickness-related loss of absorption), so thinner ITO samples tend to exhibit higher transmission. Therefore, for another mode of comparison, FIG. 8B plots corresponding NIR transmission data (1550 nm) versus calculated sheet resistance (sheet resistance=resistivity divided by thickness).

TABLE 3

Comparison of NIR transmission, resistivity, sheet resistance, and thickness for ITO materials according to the present disclosure and Comparative Examples 1-9.

| Material | Annealing Conditions | Thickness (nm) | Transmission (%) 1550 nm | Resistivity (Ohm · cm) | Sheet Resistance (Ohm/Sq.) | Haacke FoM ($\Omega^{-1}$) |
|---|---|---|---|---|---|---|
| Comparative Example 1 | room temperature deposition; no annealing | 250 | ~58.5 | $7 \times 10^{-4}$ | 28 | $1.676 \times 10^{-4}$ |
| Comparative Example 2 | 400° C. deposition; no annealing | 170 | ~52 | $2.1 \times 10^{-4}$ | 12.35 | $1.170 \times 10^{-4}$ |
| Comparative Example 3 | 400° C., 30 min; $N_2$ atmosphere; rapid thermal annealing | 500 | ~35 | $10.5 \times 10^{-4}$ | 21 | $0.0131 \times 10^{-4}$ |
| Comparative Example 4 | 300-600° C., air | 199 | ~73 | $4.58 \times 10^{-4}$ | 23.02 | $18.673 \times 10^{-4}$ |
| Comparative Example 5 | 100-400° C.; air | 250 | ~80 | $1.9 \times 10^{-3}$ | 76 | $14.128 \times 10^{-4}$ |
| Comparative Example 6 | electro-anneal; vacuum and air | 256 | ~80 | $6.7 \times 10^{-4}$ | 26.17 | $41.027 \times 10^{-4}$ |
| Comparative Example 7 | 200-350° C.; air | 500 | ~67 | $5.14 \times 10^{-4}$ | 10.28 | $17.732 \times 10^{-4}$ |
| Comparative Example 8 | 250-350° C.; 0.02 mTorr vacuum | 200 | ~52 | $3.90 \times 10^{-4}$ | 19.5 | $0.741 \times 10^{-4}$ |
| Comparative Example 9 | room temperature deposition; no annealing | 150 | ~85 | $1.4 \times 10^{-3}$ | 93.33 | $21.09 \times 10^{-4}$ |

TABLE 3-continued

Comparison of NIR transmission, resistivity, sheet resistance, and thickness for ITO materials according to the present disclosure and Comparative Examples 1-9.

| Material | Annealing Conditions | Thickness (nm) | Transmission (%) 1550 nm | Resistivity (Ohm · cm) | Sheet Resistance (Ohm/Sq.) | Haacke FoM ($\Omega^{-1}$) |
|---|---|---|---|---|---|---|
| Example 1c | 750° C., 15 min; $N_2$ atmosphere | 100 | 63.93 | $1.22 \times 10^{-4}$ | 12.2 | $9.347 \times 10^{-4}$ |
| Example 1j | 750° C., 10 hr; $N_2$ atmosphere | 100 | 82.35 | $2.2 \times 10^{-4}$ | 22 | $64.289 \times 10^{-4}$ |

Regardless of whether resistivity or sheet resistance is used as the basis for comparison HTA-ITO prepared according the present disclosure offers an improvement in transmission and resistivity (or sheet resistance) trade-offs. In other words, HTA-ITO according to the present disclosure offers a lower resistivity for a given transmission value, or a higher transmission for a given resistivity, as compared to the Comparative Examples. Even when sheet resistance is considered, although the HTA-ITO of the present disclosure appears to provide similar or only slightly better trade-offs than, e.g., Comparative Examples 6 and 7, the HTA-ITO of the present disclosure is much thinner. For example the presently disclosed HTA-ITO is 2.5 and 5 times thinner than for Comparative Examples 6 and 7, respectively. Additionally, the ITO materials of the present disclosure show an improved Haacke FoM over the Comparative Examples. For instance, Example 1j shows a transmission at 1550 nm of 82.4% and a Haacke FoM of $64.289 \times 10^{-4} \Omega^{-1}$, compared to Comparative Example 6, which shows a transmission of approximately 80% but a Haacke FoM of only $41.027 \times 10^{-4} \Omega^{-1}$.

The thin films of ITO deposited according to the present disclosure are advantageous for several reasons. While not being bound to any particular theory, it is hypothesized that using thin films on the order of 15 nm to 500 nm enables high optical transmission. Optical loss occurs primarily due to reflection at the glass-ITO interfaces and absorption by the ITO itself. By using ITO films on the order of between 15 nm to 500 nm thick (e.g., 100 nm thick), reflection does not change significantly, while absorption decreases. Thus, the transmission increases. Additionally, indium is a scarce and expensive material, so using thinner films decreases the material quantity and cost.

Figure 9A:
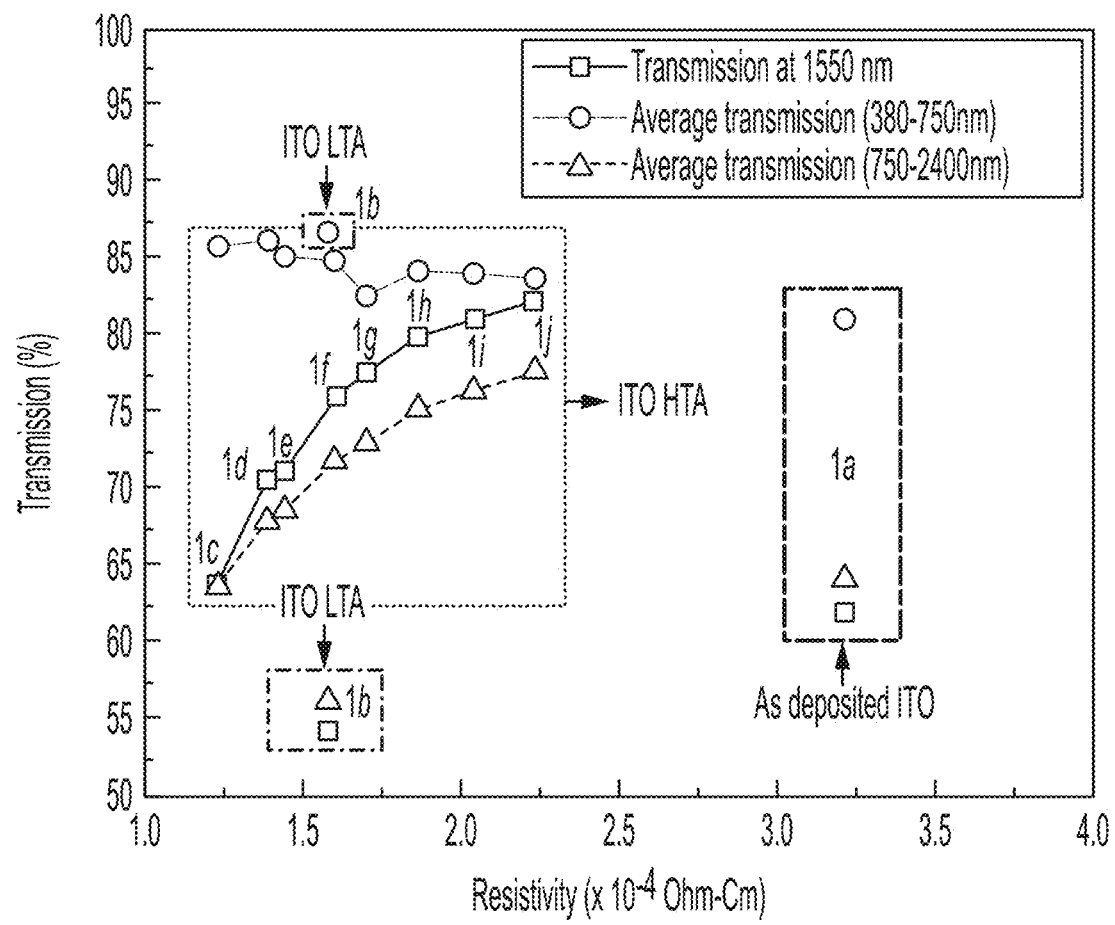
FIG. 9A shows a comparison of average transmission in the visible and near infrared spectra, as well as transmission at 1550 nm, as a function of resistivity, for as-deposited ITO (Example 1a), LTA-ITO (Example 1b) and HTA-ITO (Examples 1c-1j).

The trade-off between optical transparency in the NIR region (as shown by transmission spectra) and resistivity, as a function of annealing conditions, is shown in FIG. 9A. The chart shows data for as-deposited ITO (Example 1a), LTA-ITO annealed at 200° C. for 1 hr, in air (Example 1b), and HTA-ITO annealed at 750° C. for 15 min to 10 hr, under $N_2$ (Examples 1c-1j). In particular, the data for HTA-ITO shows the transmission in the NIR range and at 1550 nm increase markedly as annealing time at 750° C. increases, while the average transmission in the visible range slightly decreases but stays above 80%, regardless of increases in resistivity. The data shows that as the transmission increases, the resistivity also increases but remains much lower than for as-deposited ITO. FIG. 9A also shows that the NIR transmission is much higher for HTA-ITO than for LTA-ITO, for the same resistivity.

Figure 9B:
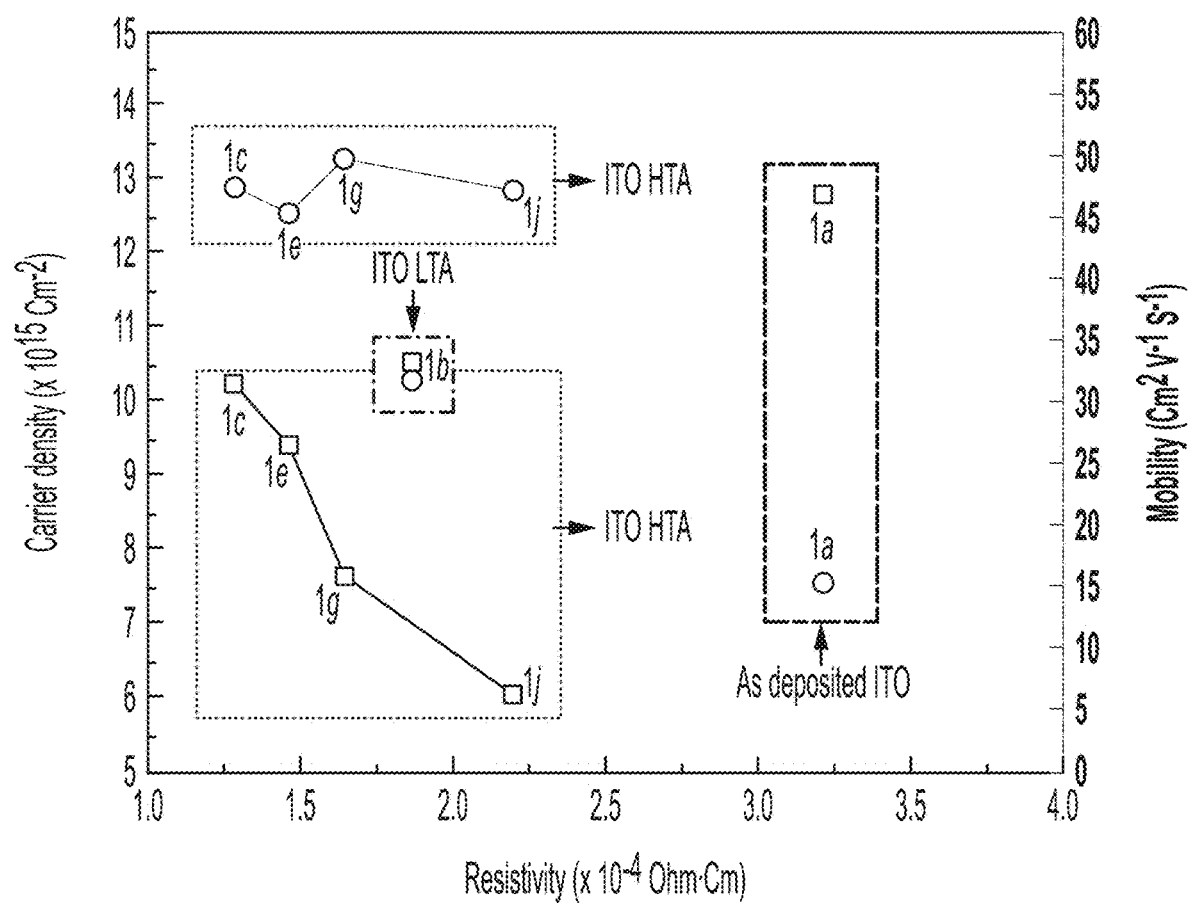
FIG. 9B shows a comparison of carrier density (■) and carrier mobility (●) as a function of resistivity, for as-deposited ITO (Example 1a), LTA-ITO (Example 1b), and HTA-ITO (Examples 1c, 1e, 1g, and 1j).

Without being bound to any particular theory, the increase in transmission in the NIR region and the corresponding increase in resistivity is believed to be a function of carrier density. The relationships among carrier density, mobility, resistivity, and annealing conditions are summarized in FIG. 9B, which plots carrier density (■) and carrier mobility (●) against resistivity for as-deposited ITO (Example 1a), LTA-ITO annealed at 200° C. for 1 hr, in air (Example 1b), and HTA-ITO annealed at 750° C. under $N_2$ atmosphere for 15 min (Example 1c), 1 hr (Example 1e), 4 hr (Example 1g), and 10 hr (Example 1j). The data show that with increased annealing time, carrier density decreases. (This corresponds to the increase in NIR transmission, as shown in FIG. 9A). The reduction in carrier density may be due to reduction of defects (i.e., doping) with increased annealing time for HTA-ITO. Meanwhile, in comparison to as-deposited ITO and LTA-ITO, the HTA-ITO maintains higher mobility due to the improvement of crystallinity with higher-temperature annealing.

What is claimed is:

1. A method for producing an article, comprising:
   (a) depositing a layer of transparent conductive material on a substrate, wherein the layer of the transparent conductive material has a thickness from about 20 nm to about 250 nm; and
   (b) annealing the transparent conductive material at a temperature of at least about 450° C. for at least about 30 minutes,
   wherein after the annealing, the transparent conductive material has a transmission of at least about 70% at 1550 nm or a Haacke figure of merit of at least about $40 \times 10^{-4} \Omega^{-1}$.

2. The method of claim 1, wherein the temperature that the annealing takes place at is from about 750° C. to about 900° C.

3. The method of claim 1, wherein the transparent conductive material comprises indium tin oxide.

4. The method of claim 1, wherein the thickness of the layer of the transparent conductive material is from about 50 nm to about 150 nm.

5. The method of claim 1, wherein the layer of the transparent conductive material has a resistivity of less than or equal to about $5 \times 10^{-4}$ Ohm-cm after the annealing.

6. The method of claim 1, wherein the depositing comprises physical vapor deposition.

7. The method of claim 1, wherein the depositing comprises magnetron sputtering.

8. The method of claim 1, wherein the annealing takes place in an atmosphere containing less than about 5% oxygen.

9. The method of claim 1, wherein the layer of the transparent conductive material has a transmission over the visible range from 380 nm to 750 nm of at least 80% after the annealing.

10. A method for modulating the resistivity and optical transmission of a transparent conductive material, comprising annealing the transparent conductive material at a temperature of at least 450° C. for at least about 30 minutes, wherein after the annealing, the transparent conductive material has a transmission of at least about 70% at 1550 nm or a Haacke figure of merit of at least about $40 \times 10^{-4}$ $\Omega^{-1}$.

11. The method of claim 10, wherein the transparent conductive material comprises indium tin oxide.

12. The method of claim 10, wherein the wherein the thickness of the layer of the transparent conductive material is from about 20 nm to about 250 nm.

13. The method of claim 10, wherein after the annealing, the transmission is at least about 80% at 1550 nm or the Haacke figure of merit is at least about $60 \times 10^{-4}$ $\Omega^{-1}$.

14. The method of claim 10, wherein after the annealing, the transmission is at least about 70% at 1550 nm and the Haacke figure of merit is at least about $40 \times 10^{-4}$ $\Omega^{-1}$.

15. The method of claim 10, wherein the annealing takes place in an atmosphere containing less than about 5% oxygen.

16. An article, comprising a layer of a transparent conductive material, wherein the layer of the transparent conductive material has a thickness of from about 20 nm to about 250 nm, at least one of a transmission of at least 70% at 1550 nm or a Haacke figure of merit of at least $40 \times 10^{-4}$ $\Omega^{-1}$ and the article is produced using the method of claim 1.

17. The article of claim 16, wherein the transparent conductive material comprises indium tin oxide.

18. The article according to claim 16, wherein the layer of the transparent conductive material has a resistivity of less than or equal to about $5 \times 10^{-4}$ Ohm-cm.

19. The article of claim 16, wherein the transmission is at least about 80% at 1550 nm and the Haacke figure of merit is at least about $60 \times 10^{-4}$ $\Omega^{-1}$.

20. The article of claim 16, wherein the layer of the transparent conductive material has a transmission in the visible range of at least 80%.

\* \* \* \* \*

UNITED STATES PATENT AND TRADEMARK OFFICE
CERTIFICATE OF CORRECTION

| | |
|---|---|
| PATENT NO. | : 11,891,687 B2 |
| APPLICATION NO. | : 17/038991 |
| DATED | : February 6, 2024 |
| INVENTOR(S) | : Rinu Maniyara et al. |

It is certified that error appears in the above-identified patent and that said Letters Patent is hereby corrected as shown below:

In the Claims

In Column 23, Line 5, in Claim 12, delete "wherein the wherein the" and insert -- wherein the --.

Signed and Sealed this
Nineteenth Day of November, 2024

Katherine Kelly Vidal
*Director of the United States Patent and Trademark Office*